US010819376B2

(12) United States Patent
Rhodes

(10) Patent No.: US 10,819,376 B2
(45) Date of Patent: Oct. 27, 2020

(54) MICROWAVE SWITCHED MULTIPLEXER AND A MOBILE TELECOMMUNICATIONS DEVICE INCLUDING SUCH A MULTIPLEXER

(71) Applicant: ISOTEK MICROWAVE LIMITED, Yorkshire (GB)

(72) Inventor: David Rhodes, Menston Yorkshire (GB)

(73) Assignee: ISOTEK MICROWAVE LIMITED, Yorkshire (GB)

(*) Notice: Subject to any disclaimer, the term of this patent is extended or adjusted under 35 U.S.C. 154(b) by 207 days.

(21) Appl. No.: 16/326,610

(22) PCT Filed: Sep. 8, 2016

(86) PCT No.: PCT/GB2016/052769
§ 371 (c)(1),
(2) Date: Feb. 19, 2019

(87) PCT Pub. No.: WO2017/042560
PCT Pub. Date: Mar. 16, 2017

(65) Prior Publication Data
US 2019/0222234 A1 Jul. 18, 2019

(30) Foreign Application Priority Data

Sep. 8, 2015 (GB) .................................. 1515922.1
Oct. 26, 2015 (GB) .................................. 1518890.7
Oct. 26, 2015 (GB) .................................. 1518893.1

(51) Int. Cl.
H04B 1/00 (2006.01)
H04B 1/69 (2011.01)
(Continued)

(52) U.S. Cl.
CPC ........... *H04B 1/006* (2013.01); *H01P 1/2136* (2013.01); *H03H 7/465* (2013.01); *H04B 1/0057* (2013.01);
(Continued)

(58) Field of Classification Search
CPC ............. H04B 1/69; H05B 6/705; H05B 6/72
See application file for complete search history.

(56) References Cited

U.S. PATENT DOCUMENTS 5,781,847 A * 7/1998 Clarke .................... H03L 7/141
455/69
6,806,791 B1 10/2004 Wang et al.
(Continued)

FOREIGN PATENT DOCUMENTS

CA 1194157 A 9/1985

OTHER PUBLICATIONS

UK Intellectual Property Office Search Report issued in UK Application No. GB1515922.1 dated Jan. 11, 2016.
(Continued)

Primary Examiner — Raj Jain
(74) Attorney, Agent, or Firm — Quinn IP Law

(57) ABSTRACT

A microwave switched multiplexer having a bandpass $\Delta f$ between frequencies f1 and f2, $\Delta f = f1 - f2$, the multiplexer comprising an input microwave resonant waveguide; an output microwave resonant waveguide; and, n transmission channels where n>1, each transmission channel coupled to the input microwave resonant waveguide and the output microwave resonant waveguide, each transmission channel having a transmission bandpass at a center frequency within $\Delta f$, the center frequencies of the transmission channels being equally spaced apart in frequency by $\Delta f/n$; each transmission channel comprising (a) an input resonator coupled to the input microwave resonant waveguide; (b) an output resonator coupled to the output microwave resonant waveguide: (c) a center resonator coupled to the input and output resonators, the three resonators being coupled together in cascade; (d) a tuning mechanism connected to the center resonator and adapted to be switched between on and off states, in the on state the resonant frequency of the center resonator being the
(Continued)

same as that of the input and output resonators and in the off state the resonant frequency of the center resonator being outside the bandpass Δf.

17 Claims, 20 Drawing Sheets

(51) Int. Cl.
  *H05B 6/70* (2006.01)
  *H03H 7/01* (2006.01)
  *H03H 7/46* (2006.01)
  *H01P 1/213* (2006.01)
  *H03H 9/70* (2006.01)
  *H03H 9/72* (2006.01)
  *H03H 9/17* (2006.01)

(52) U.S. Cl.
  CPC .............. *H04B 1/69* (2013.01); *H05B 6/705* (2013.01); *H03H 7/0161* (2013.01); *H03H 9/171* (2013.01); *H03H 9/706* (2013.01); *H03H 9/725* (2013.01)

(56) References Cited

U.S. PATENT DOCUMENTS

| | | | | |
|---|---|---|---|---|
| 8,432,152 | B2* | 4/2013 | de Graauw | H01Q 3/34 |
| | | | | 324/76.51 |
| 10,158,259 | B1* | 12/2018 | Leabman | H04B 5/0037 |
| 2004/0196114 | A1 | 10/2004 | Aiga et al. | |
| 2005/0084033 | A1* | 4/2005 | Rosen | H04B 1/69 |
| | | | | 375/295 |
| 2006/0114082 | A1 | 6/2006 | Hidalgo Carpintero et al. | |
| 2009/0147805 | A1* | 6/2009 | Wada | H01P 1/2135 |
| | | | | 370/497 |
| 2010/0134216 | A1* | 6/2010 | Naji | H01P 7/08 |
| | | | | 333/235 |
| 2011/0169589 | A1 | 7/2011 | Franzon et al. | |
| 2012/0067872 | A1* | 3/2012 | Libman | H05B 6/688 |
| | | | | 219/702 |
| 2014/0043114 | A1 | 2/2014 | Mobbs | |
| 2015/0229386 | A1* | 8/2015 | Lange | H04B 7/155 |
| | | | | 370/317 |
| 2015/0302231 | A1* | 10/2015 | Makimoto | H01P 1/20363 |
| | | | | 340/10.1 |
| 2019/0222234 | A1* | 7/2019 | Rhodes | H04B 1/0057 |

OTHER PUBLICATIONS

UK Intellectual Property Office Search Report issued in UK Application No. GB1518893.1.1 dated Apr. 29, 2016.
UK Intellectual Property Office Search Report issued in UK Application No. GB1615252.2 dated Feb. 22, 2017.
International Search Report issued in International Application No. PCT/GB2016/052769 dated Dec. 6, 2016.
A. Morini et al., Improvement of dual-manifold architecture for the design of reconfigurable diplexers, 2015 IEEE MTT-S International Microwave Symposium, May 1, 2015, pp. 1-4.

* cited by examiner

MICROWAVE SWITCHED MULTIPLEXER AND A MOBILE TELECOMMUNICATIONS DEVICE INCLUDING SUCH A MULTIPLEXER

The present invention relates to a microwave switched multiplexer. More particularly, but not exclusively, the present invention relates to a microwave switched multiplexer comprising n (n>1) transmission channels coupled at each end to input and output microwave resonant waveguides, each transmission channel comprising input output and center resonators, the admittances of the input microwave resonant waveguide, input resonator, center resonator and output resonator being in the ratios as claimed. The present invention also relates to a mobile telecommunications device including such a microwave switched multiplexer.

Switched multiplexers are constructed from the parallel connection of N channel filters each of which can be switched on or off at the same time thus producing a frequency dependent device which can have $2^N$ different states. Such devices have been available for over 30 years but suffer from the fact that the frequency selective filters had increasing group delay and loss at the cross over point between channels and hence if two adjacent channels were switched on the increased loss and group delay occurred at the center of the combined channels.

One method used to overcome this problem is to power divide between alternate channels and recombine at the output. However, this technique increases the overall loss by 6 dB. Also the rapid change in group delay at the cross over frequency makes phase tracking of devices (a necessity in interferometer systems) extremely difficult. Typically 8 or more channels are required.

Microwave switched multiplexers having a plurality of transmission channels each comprising resonators coupled together in cascade are also known. Such multiplexers however suffer from high loss, in particular effectively impedance matching to the multiplexer across the passband of the multiplexer has to date proved impossible, resulting in high loss.

The present invention seeks to overcome the problems of the prior art.

Accordingly, the present invention provides a microwave switched multiplexer having a bandpass $\Delta f$ between frequencies f1 and f2, $\Delta f = f1 - f2$, the multiplexer comprising an input microwave resonant waveguide;

an output microwave resonant waveguide; and, n transmission channels where n>1, each transmission channel coupled to the input microwave resonant waveguide and the output microwave resonant waveguide, each transmission channel having a transmission bandpass at a center frequency within $\Delta f$, the center frequencies of the transmission channels being equally spaced apart in frequency by $\Delta f/n$;

each transmission channel comprising (a) an input resonator coupled to the input microwave resonant waveguide;

(b) an output resonator coupled to the output microwave resonant waveguide;

(c) a center resonator coupled to the input and output resonators, the three resonators being coupled together in cascade;

(d) a tuning mechanism connected to the center resonator and adapted to be switched between on and off states, in the on state the resonant frequency of the center resonator being the same as that of the input and output resonators and in the off state the resonant frequency of the center resonator being outside the bandpass $\Delta f$;

the admittances of the input microwave resonant waveguide, input resonator, center resonator and output resonator being in the ratio $$y/n:\pi/2:4x/\pi:\pi/2$$

where y is in the range 0.5 to 1.1 and
where y is in the range 0.5 to 1.5 the admittances of the input, center and output resonators having absolute values such that for every transmission channel when the tuning mechanism of the transmission channel is in the on state and the tuning mechanisms of all other transmission channels are in the off state the width of the transmission bandpass of the transmission channel is substantially $\Delta f/n$ The microwave switched multiplexer according to the invention has no additional loss at the cross over frequencies from one transmission channel to the next. Further, the group delay remains flat (linear phase) through the cross over when adjacent channels are switched on. Further, one can impedance match to the microwave switched multiplexer across the passband with almost no additional loss.

Preferably y is in the range 0.8 to 1.2, more preferably 0.9 to 1.1, more preferably 0.95 to 1.05.

Preferably x is in the range 0.95 to 1.05, more preferably 0.97 to 1.03, more preferably 0.99 to 1.01.

Preferably n is odd. Alternatively n is even.

Preferably the admittance of the output microwave resonant waveguide is equal to the admittance of the input microwave resonant waveguide.

Preferably each resonator comprises an electrically conducting resonant cavity comprising first and second end faces and a side wall extending therebetween, the resonator further comprising a dielectric member arranged within the cavity and spaced apart from the end faces;

the distance between the first and second end faces defining the length of the cavity, the width of the cavity in a plane normal to the length being at least four times the length.

Preferably the dielectric member of the center resonator comprises an aperture extending therethrough, the tuning mechanism comprising a rod which can be inserted or removed from the aperture to switch the center resonator between on and off states.

Alternatively each resonator comprises an electrically conducing cavity comprising first and second end faces and a side wall extending therebetween, the resonator further comprising a resonator post extending from an end face part way to the opposite end face.

Preferably the tuning mechanism comprises an electrical switch extending between the resonator post of the center resonator to the spaced apart end face.

Alternatively each resonator is an FBAR or SAW resonator.

Preferably the microwave switched multiplexer further comprises a microwave source connected to the input microwave resonant waveguide, the microwave source being adapted to provide a microwave signal having a frequency between $f_1$ and $f_2$.

In a further aspect of the invention there is provided a mobile telecommunications device comprising at least one microwave switched multiplexer as claimed in any one of claims 1 to 12.

The present invention will now be described by way of example only and not in any limitative sense with reference to the accompanying drawings in which FIG. 1 shows an equivalent circuit for $Y_o(p)$ of a transmission line;

FIG. 4a shows insertion loss and return loss for a 20 transmission channel multiplexer not according to the invention with all channels switched on;

FIG. 4b shows the insertion loss and group delay for the multiplexer of FIG. 4a;

FIG. 6a shows the insertion loss and return loss for the multiplexer of FIG. 4a with one channel switched on;

FIG. 6b shows the group delay for the multiplexer of FIG. 4a with one channel switched on;

FIG. 8a shows the insertion loss and return loss for the multiplexer of FIG. 4a with three channels switched on:

FIG. 10a shows the insertion loss and return loss for the multiplexer of FIG. 4a with two channels switched on;

FIG. 10b shows the group delay for the multiplexer of FIG. 4a with two channels switched on;

FIG. 12a shows the insertion loss and return loss for the multiplexer of FIG. 4a with four channels switched on;

FIG. 12b shows the group delay for the multiplexer of FIG. 4a with four channels switched on;

FIG. 14(a) shows insertion loss and return loss for a 20 channel microwave switched multiplexer according to the invention with all channels switched on;

Figure 14A:
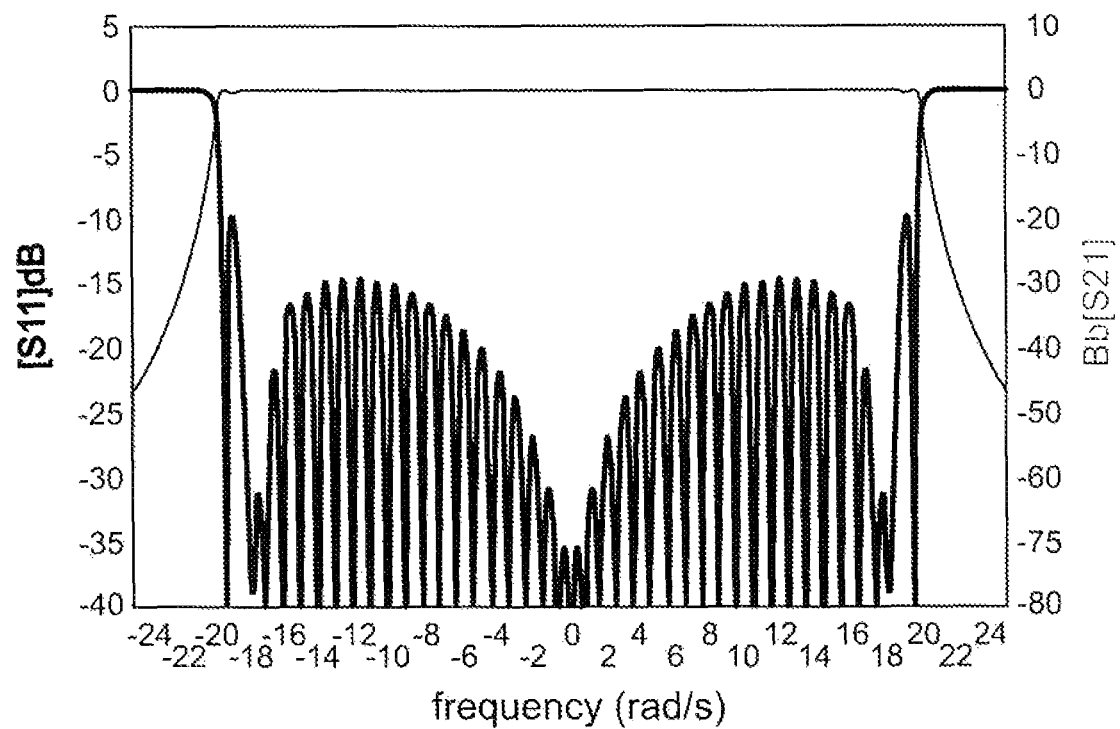
Figure 14B:
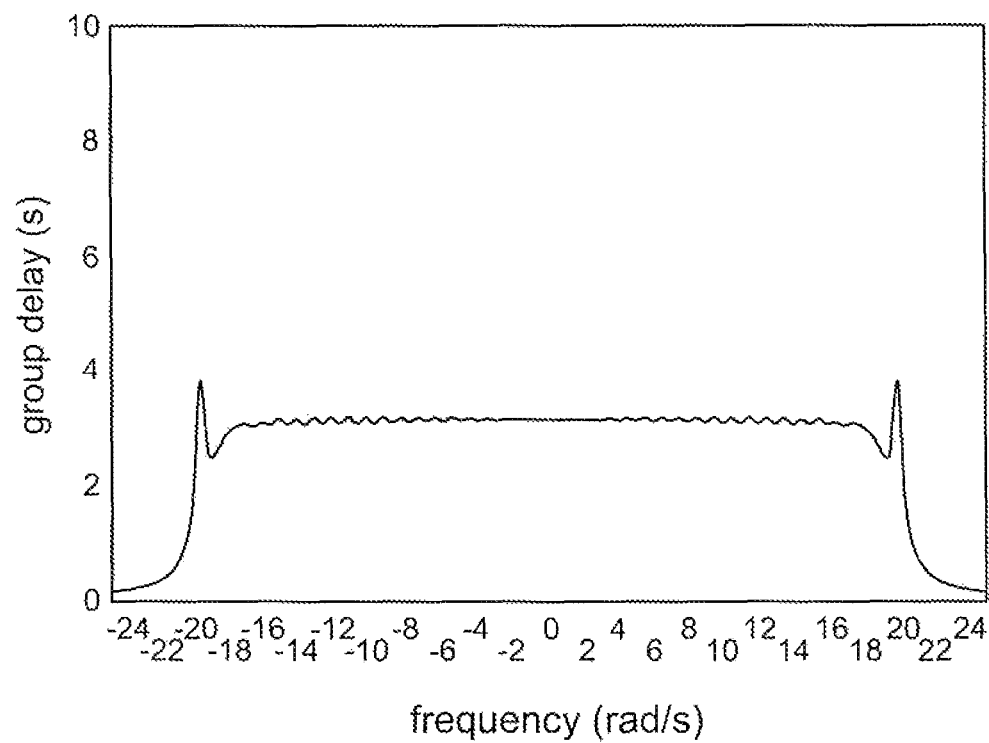
FIG. 14(b) shows the group delay for the multiplexer of FIG. 14(a)
Figure 15A:
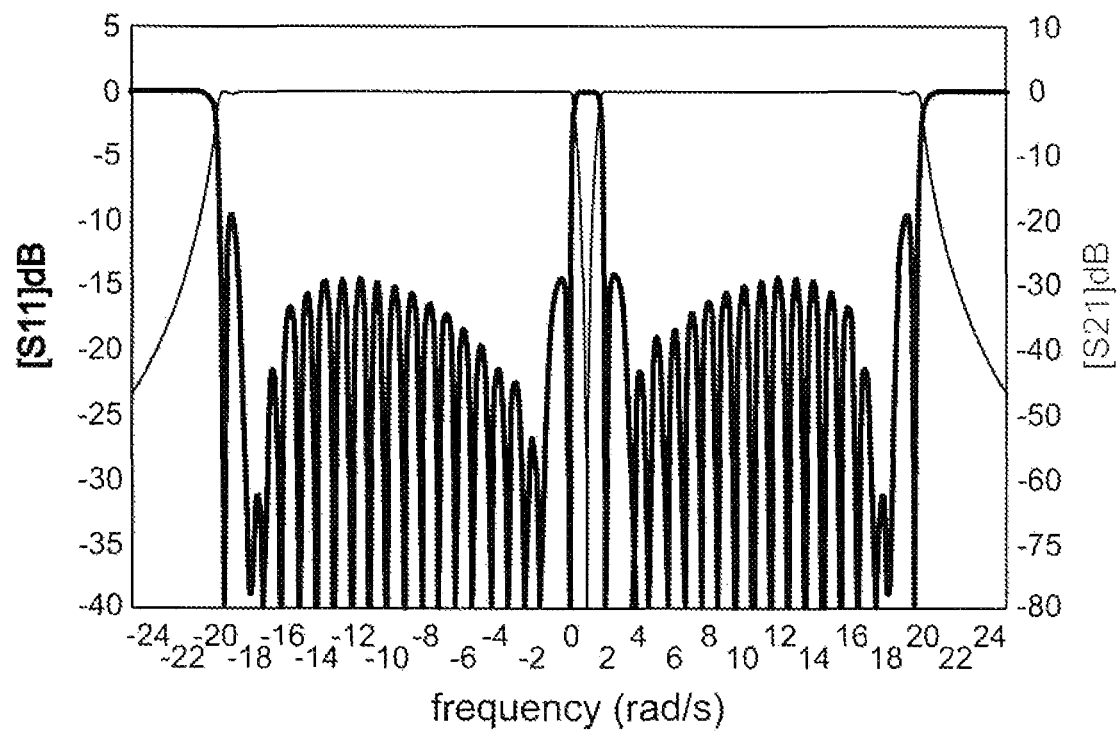
Figure 15B:
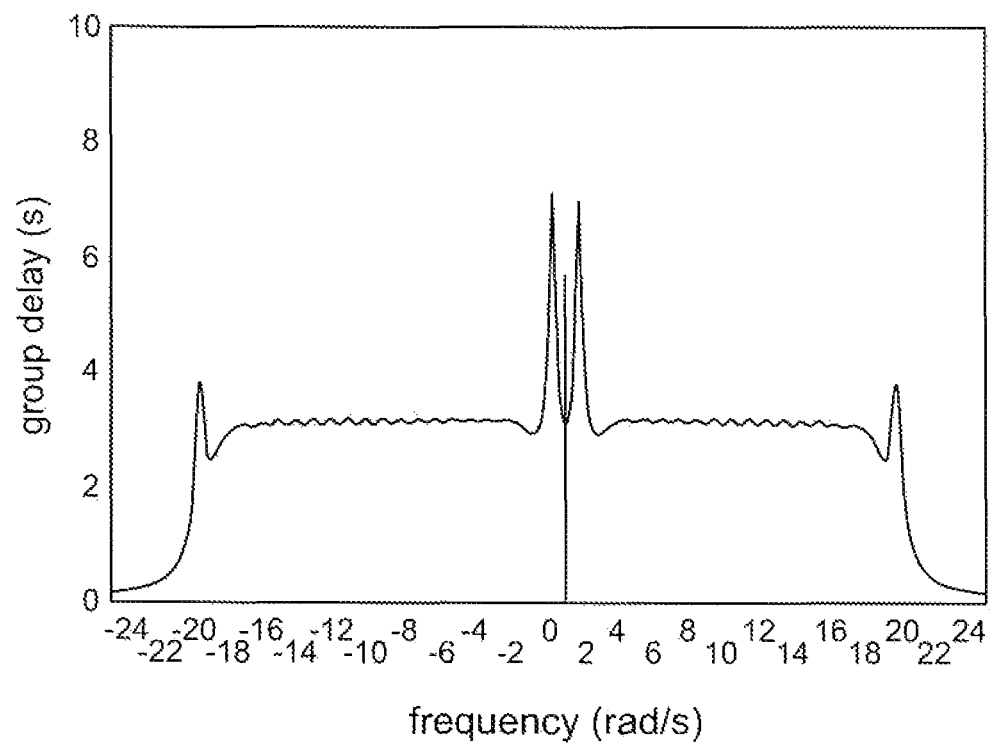
Figure 16A:
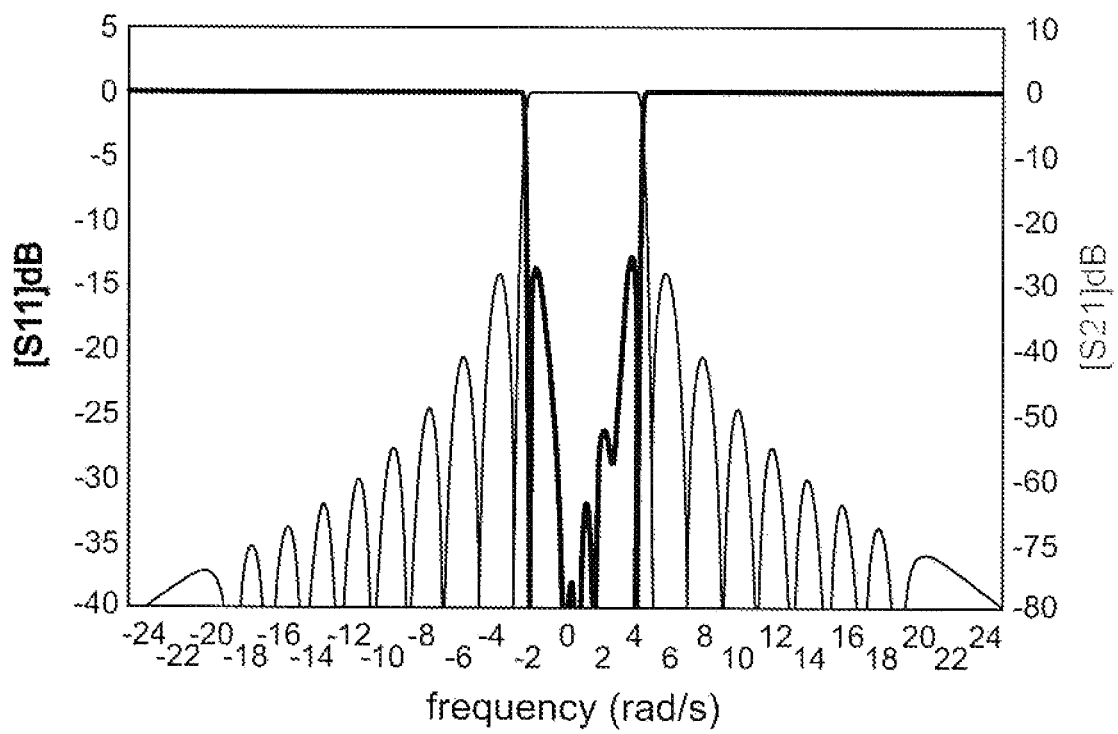
Figure 16B:
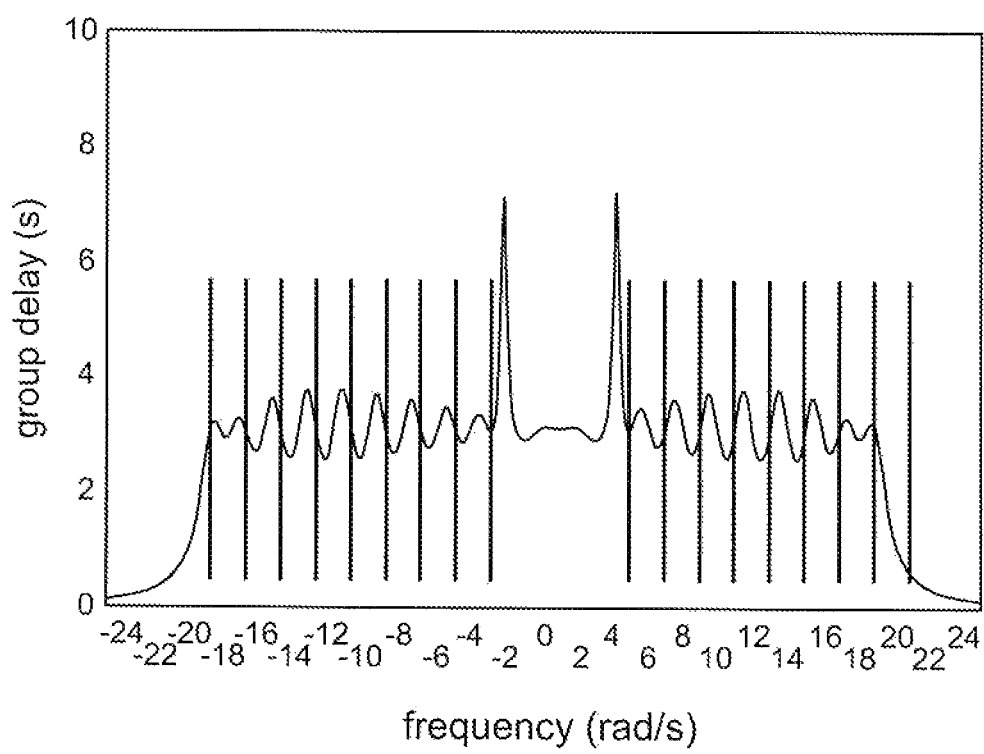
Figure 17A:
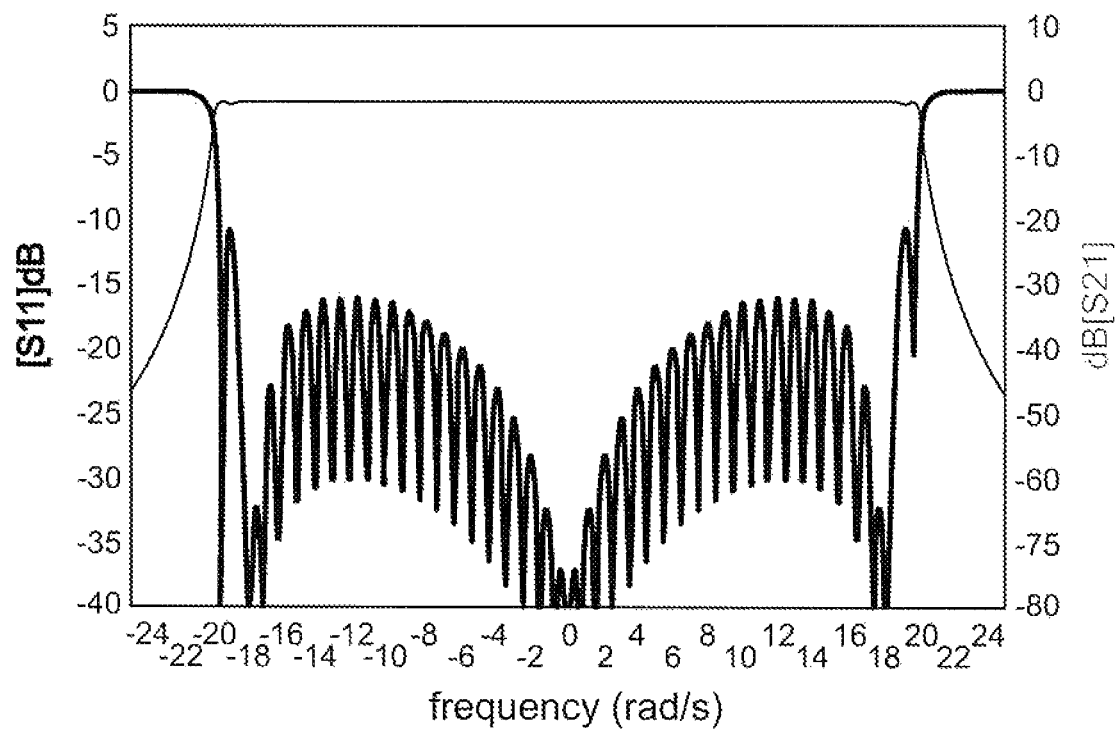
Figure 17B:
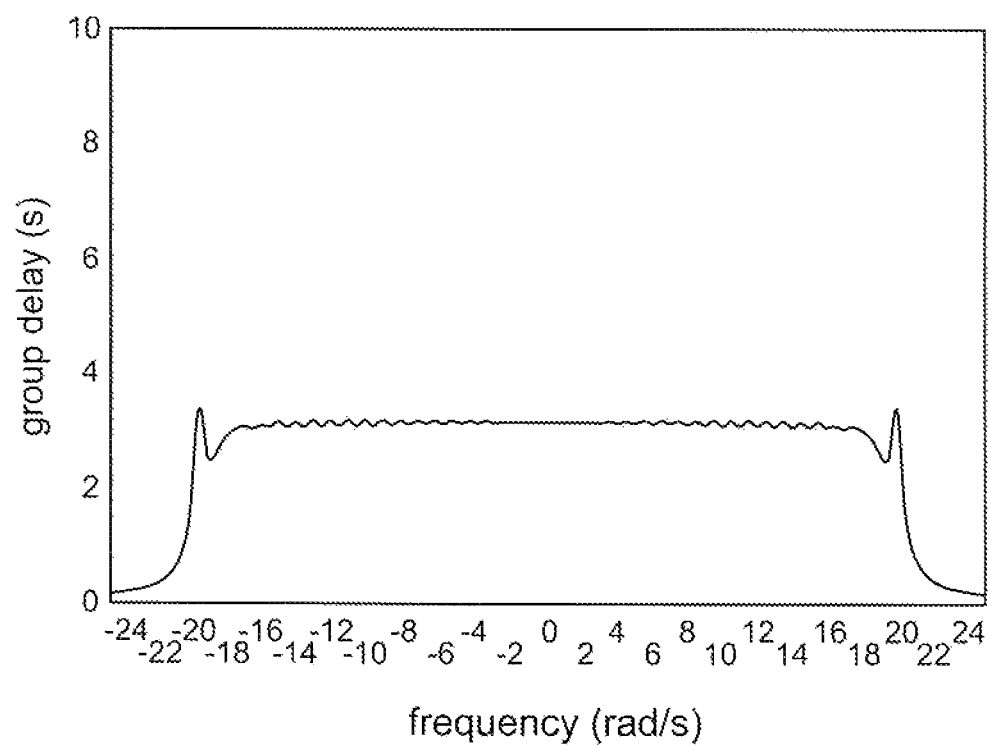
Figure 18:
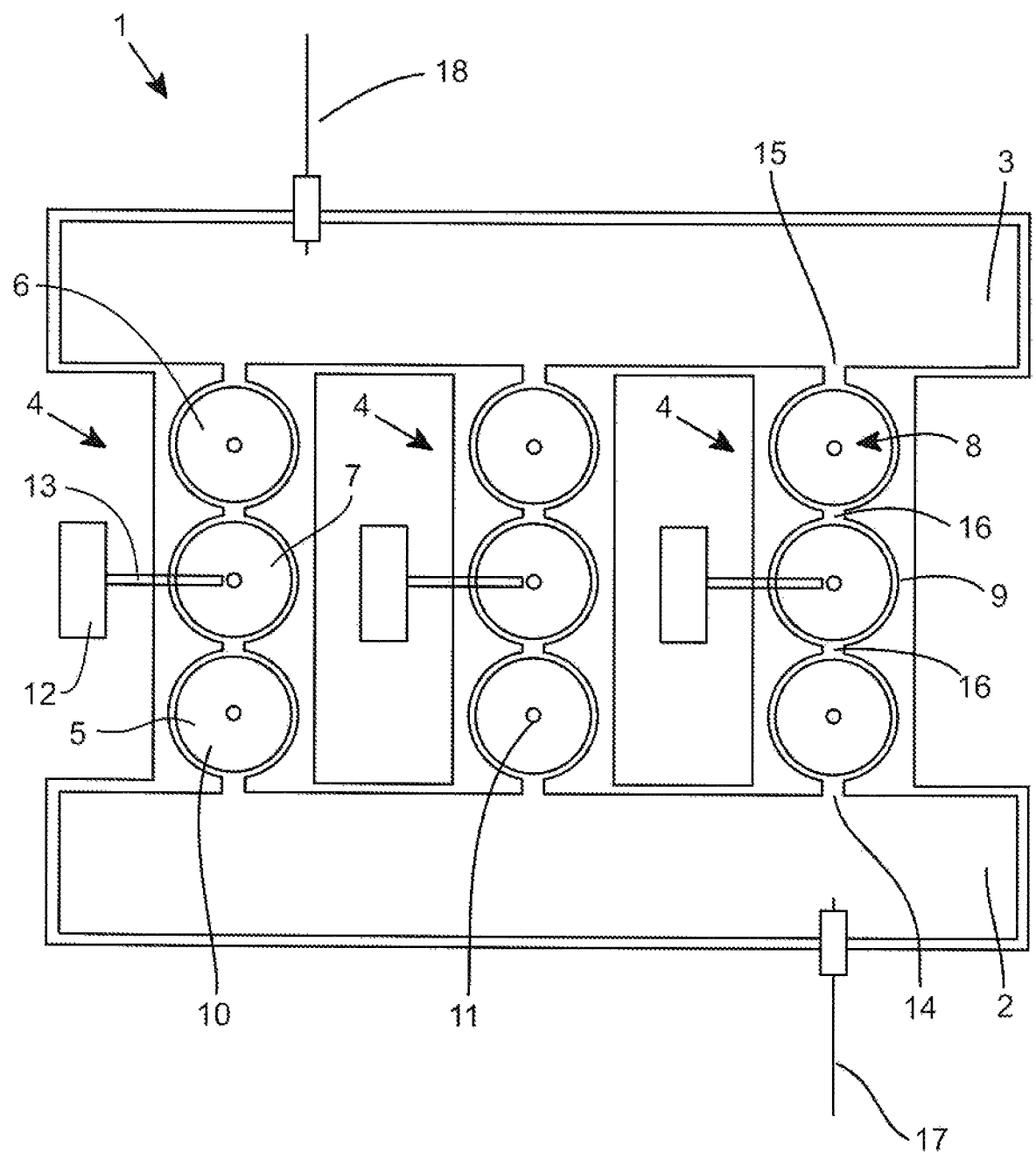
Figure 19:
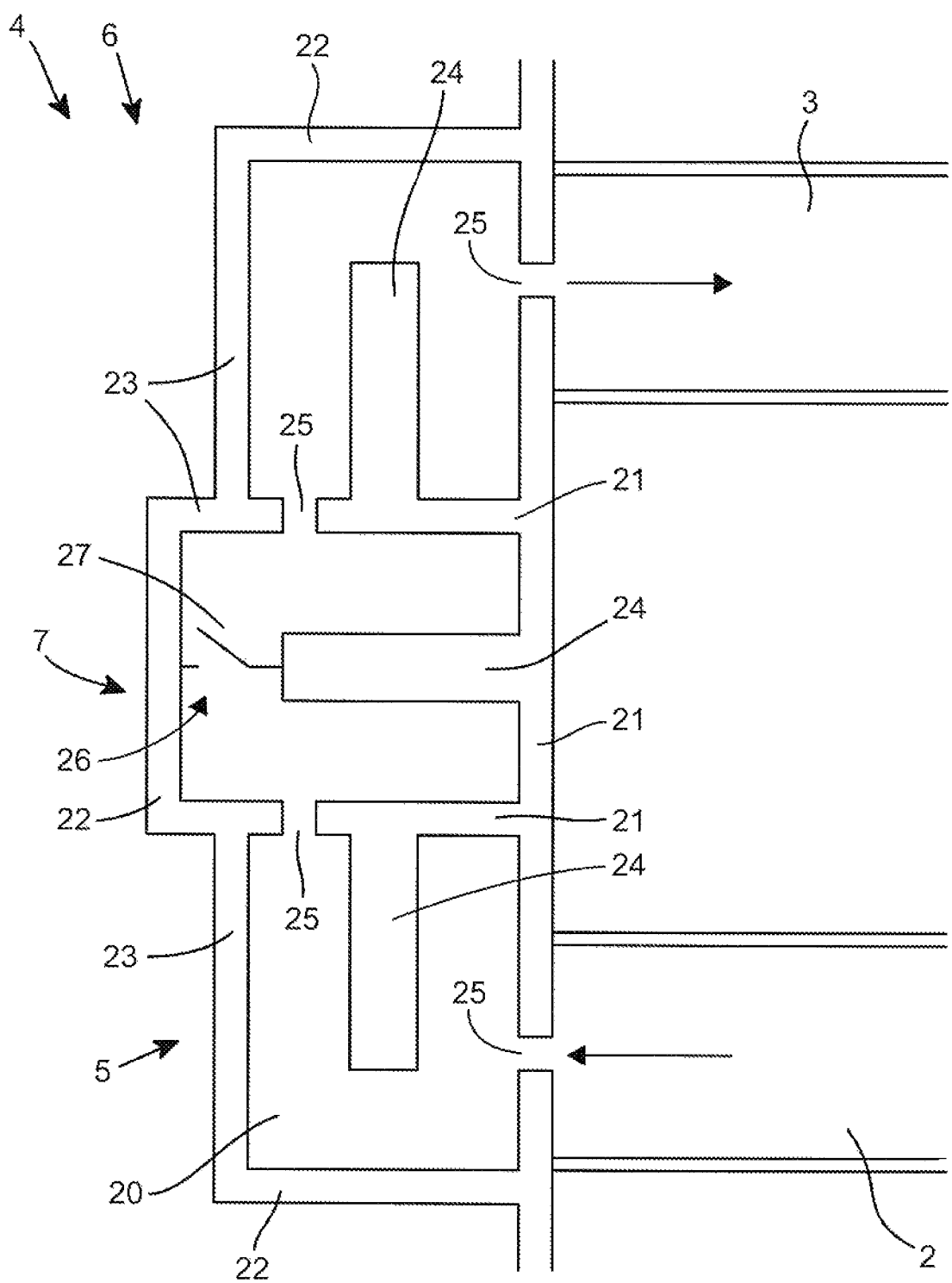
Figure 20:
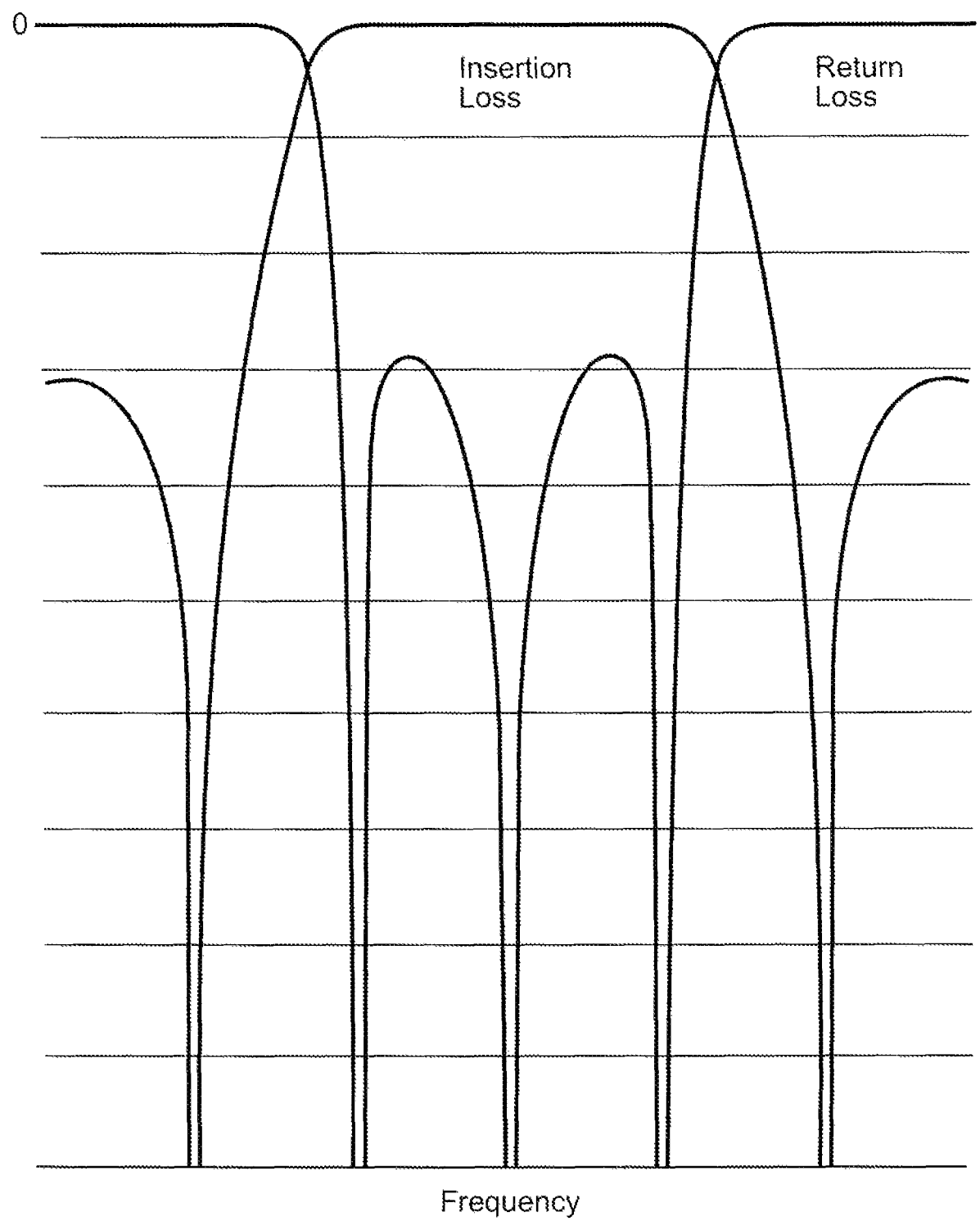

FIGS. 15(a) and 15(b) are equivalent plots to FIGS. 14(a) and 14(b) with one channel turned off;

FIGS. 16(a) and 16(b) are equivalent plots to FIGS. 14(a) and 14(b) with three channels turned on;

FIGS. 17(a) and 17(b) are equivalent plots to FIGS. 14(a) and 14(b) with all channels on but with the resonators having finite Q;

FIG. 18 shows an embodiment of a multiplexer according to the invention in cross section:

FIG. 19 shows a transmission channel of a further embodiment of a multiplexer according to the invention; and, FIG. 20 shows the bandpass of a single transmission channel within the bandpass and close to the edges.

The key aspect of the design of the microwave switched multiplexer according to the invention is that it is designed as a parallel connection of resonant elements such that in the 'all on' state the device represents a known circuit with no loss (in the lossless case) and constant group delay (linear phase) at all frequencies. Such a circuit is equivalent to a length of transmission line matched to the load and source resistance (normalised to 1 0hm) and defined by a transfer matrix—

$$[T] = \begin{bmatrix} c & s \\ s & c \end{bmatrix}$$

Where $c=\cos h\,(\pi p)$ and $s=\sin h\,(\pi p)$, where p is the normalised complex frequency variable.

The reflection coefficient $S_{11}(p)$ and the transmission coefficient $S_{11}(p)$ are defined in terms of even $Y_e(p)$ and odd $Y_o(p)$ admittances of the network as $$S_{11}(p) = \frac{1 - Y_e(p)Y_o(p)}{(1+Y_e(p))*(1+Y_o(p))} \text{ and}$$

$$S_{12}(p) = \frac{Y_e(p) - Y_o(p)}{(1+Y_e(p))*(1+Y_o(p))}$$

Where from the above one has $$Y_e(p) = \tanh\left(\frac{\pi p}{2}\right)$$

$$Y_o(p) = \coth\left(\frac{\pi p}{2}\right)$$

And hence $S_{11}(p)=0$ and $S_{12}(p)=e^{-\pi p}$

Hence, the circuit is matched at all frequencies with a linear phase of $\pi\omega$ ($p=j\omega$).

To form the equivalent parallel connection of circuit elements a partial fraction expansion of $Y_e(p)$ and $Y_o(p)$ is performed—

Hence, $$Y_o(p) = \coth\left(\frac{\pi p}{2}\right) = \sum_{r=-\infty}^{r=+\infty} \frac{Ar}{p+j2r} = \frac{2}{\pi}\sum_{r=-\infty}^{r=+\infty} \frac{1}{p+j2r}$$

Figure 1:
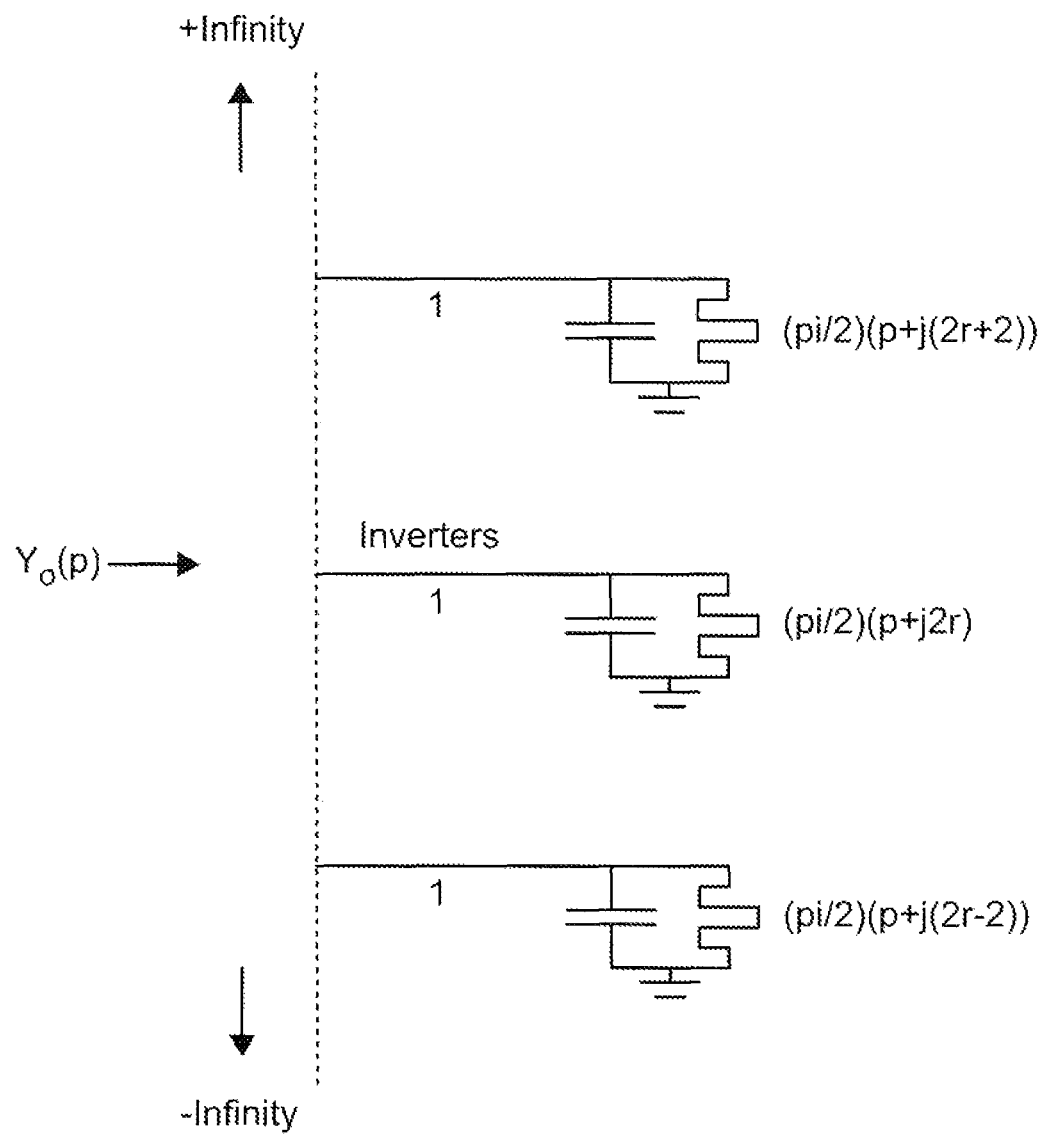

Thus, the equivalent circuit for $Y_o(p)$ is as shown in FIG. 1

For $Y_e(p)$, $$Y_e(p) = \tanh(p) = \frac{2}{\pi}\sum_{r=-\infty}^{r=+\infty} \frac{1}{p+j(2r-1)}$$

This may be decomposed into the sum of two infinite series as $$Y_e(p) = \frac{1}{\pi}\sum_{r=-\infty}^{r=+\infty}\left[\frac{1}{p+j(2r-1)} + \frac{1}{p+j(2r+1)}\right] =$$

$$\frac{2}{\pi}\sum_{r=-\infty}^{r=+\infty}\left[\frac{p+2jr}{(p+2jr)^2+1}\right] = \frac{2}{\pi}\sum_{r=-\infty}^{r=+\infty}\left[\frac{1}{(p+j2r)+\frac{1}{(p+j2r)}}\right]$$

Figure 2:
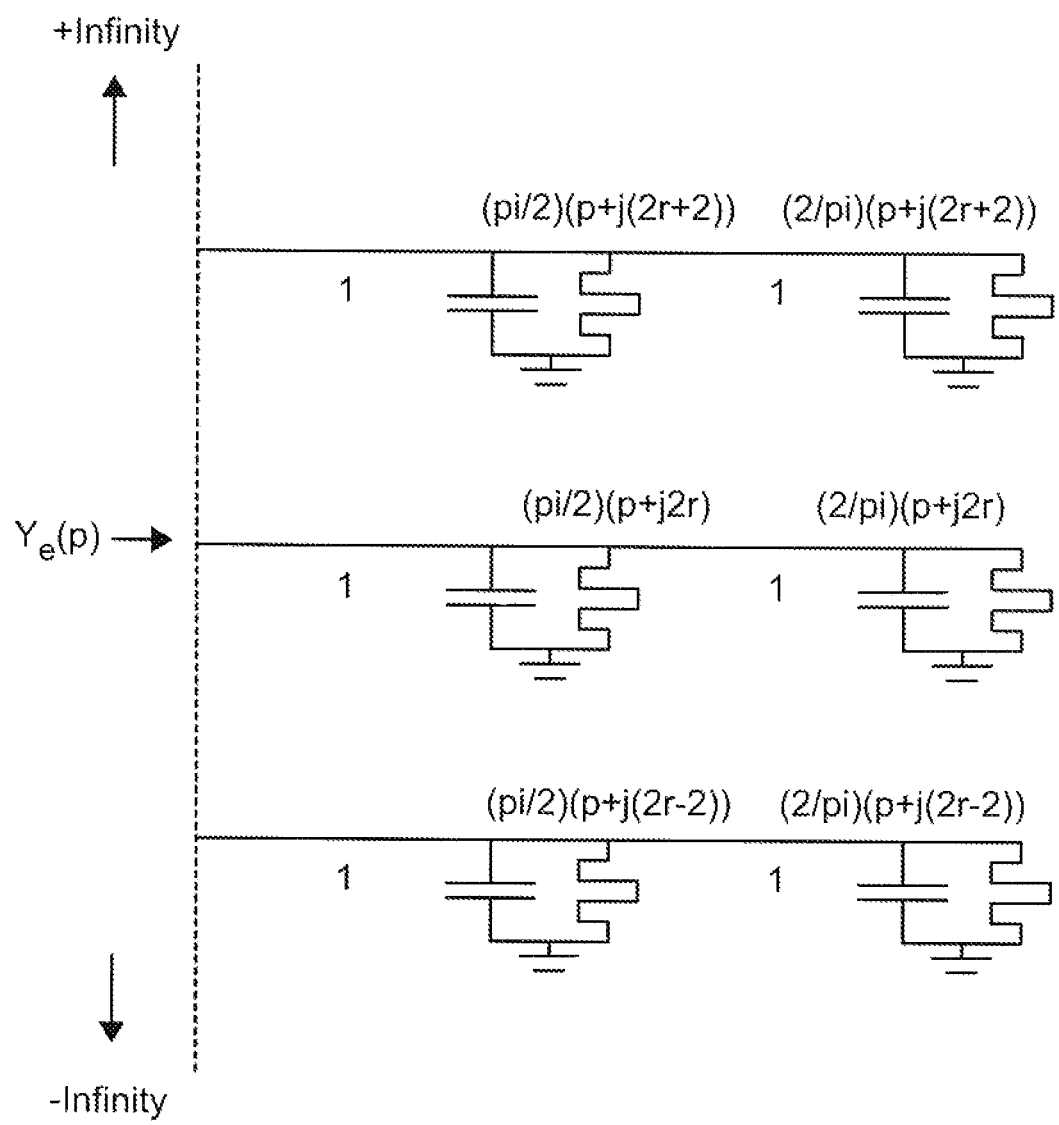
FIG. 2 shows an equivalent circuit for $Y_e(p)$ of a transmission line.

Thus, the equivalent circuit for $Y_e(p)$ is as shown in FIG. 2.

Figure 3:
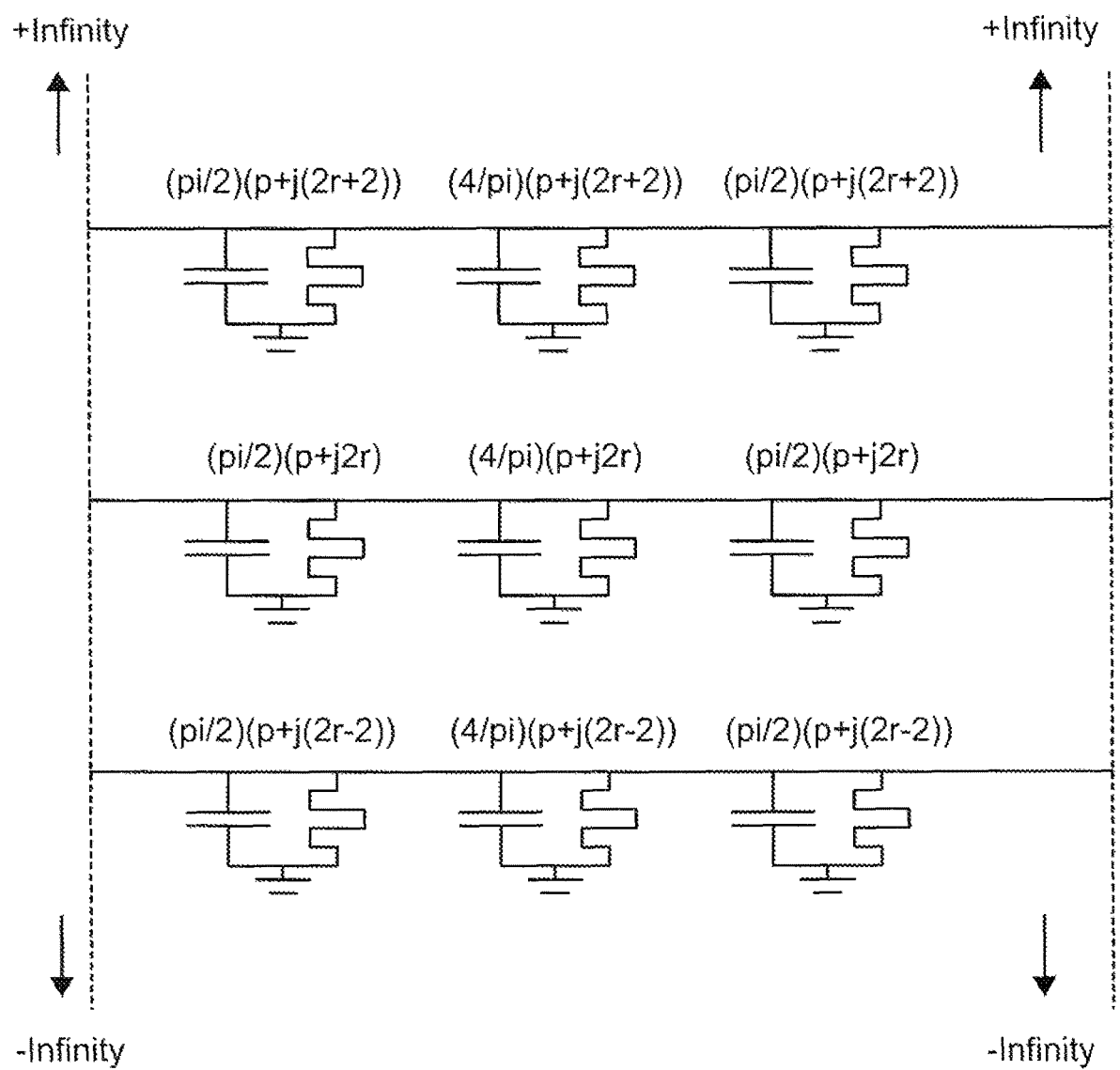
FIG. 3 shows an equivalent circuit for a combination of $Y_o(p)$ and $Y_e(p)$ of a transmission line.

Combining the even and odd mode networks gives the circuit as shown in FIG. 3. The circuit of FIG. 3 can be viewed as a multiplexer comprising an infinite number of transmission channels equally spaced apart in frequency. Each transmission channel comprises three resonators connected together in cascade, an input resonator coupled to an input waveguide for receiving the microwave signal, an output resonator coupled to an output waveguide and a center resonator connected between the two. The resonators are connected in cascade. In each transmission channel the admittances of the resonators are in the ratio $\pi/2:4/\pi:\pi/2$ (and in fact have these absolute values in this normalised model). The admittances of equivalent resonators in each channel are the same (ie all input resonators have the same admittance, all center resonators have the same admittance and all output resonators have the same admittance). The transmission channels are spaced equally apart in frequency. Whilst the transmission channels are shown physically spaced apart the input resonators are each connected to a common signal input point. Similarly the output resonators are connected to a common signal output point.

This idealised multiplexer with an infinite number of transmission channels has the property that it is matched at all frequencies and has a constant delay at all frequencies. To convert this multiplexer into a switched multiplexer a tuning mechanism is connected to the central resonator of each transmission channel which can be switched between 'on' and 'off' configurations. When in the 'on' configuration the resonant frequency of the associated central resonator in a transmission channel is the same as that of the input and output resonators of that channel. When in the 'off' configuration the resonant frequency of the associated central resonator is remote from that of the input and output resonators of that channel such that the central resonator is effectively shorted out.

Independent of which transmission channels are switched on or off (A transmission channel is said to be on if the tuning mechanism of the center resonator of the transmission channel is in the on configuration and off if the tuning mechanism is in the off configuration) the odd mode admittance remains the same. For the even mode admittance however if the central resonator is shorted that component of the even mode network becomes the same as the equivalent component of the odd mode network.

For a multiplexer with a finite number of transmission channels the elements which make up the transmission channels are identical to the elements in the infinite network. There is an important difference however. If there are n channels the multiplexer has a bandpass of 2n in frequency, with each transmission channel having a transmission bandpass of 2. The tuning mechanism when in the off state tunes the resonant frequency of the associated center resonator out of the bandpass of the multiplexer.

If the microwave switched multiplexer having a finite number, n, of transmission channels has a bandpass $\Delta f$ between $f_1$ and $f_2$ then the admittances of the resonators will still have the same ratios. However, the absolute values of the admittances need to be scaled such that the transmission bandpass of each transmission channel is $\Delta f/n$. The frequencies of the resonators are set such that the transmission channels are spaced equally apart by $\Delta f/n$ so together covering the multiplexer bandpass $\Delta f$. Another way of saying this is that the transmission bandpasses are substantially contiguous.

Figure 4A:
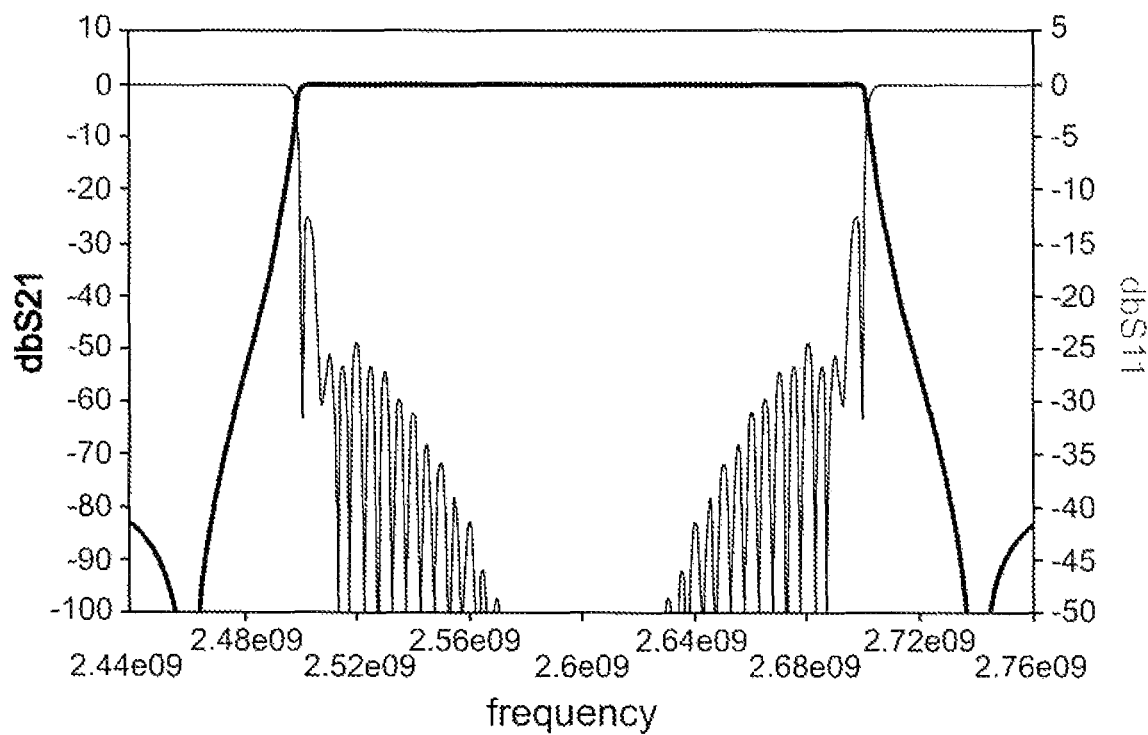
Figure 4B:
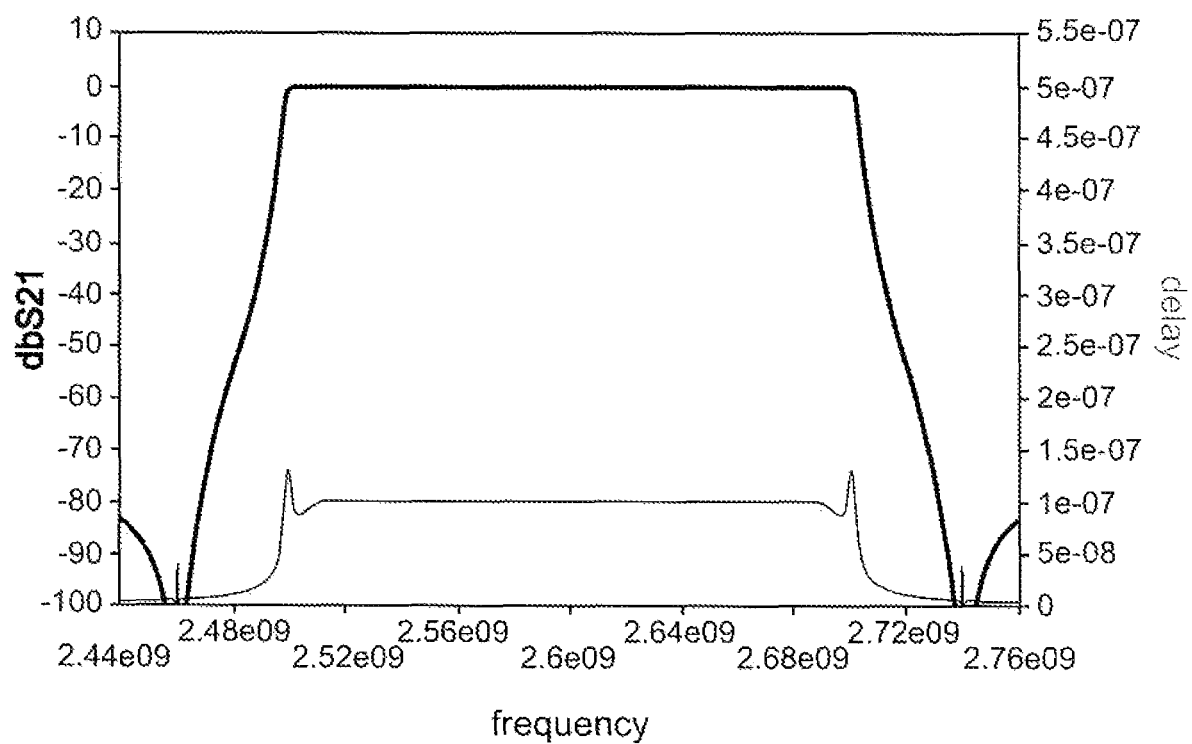

The insertion loss and return loss for such a multiplexer with all transmission channels on is shown in FIG. 4(a). In FIG. 4(b) the insertion loss and group delay are plotted with a constant delay of 100 ns across most of the multiplexer bandpass. The switched microwave multiplexer has 20 transmission channels. Each transmission channel has a transmission band 10 MHz in width. The transmission channels are equally separated from each other to cover the multiplexer bandpass between 2.5 and 2.7 GHz. The multiplexer further comprises additional resonant cavities connected as stubs at the common signal input and output points having resonant frequencies above and below the multiplexer band. The additional resonant cavities approximate to the behaviour inband of the missing n+1 to infinity channels. This multiplexer is not according to the invention and is included for explanatory purposes only.

To illustrate what happens to the behaviour of such a multiplexer when transmission channels are switched off only channels near to the center of the multiplexer bandpass are considered. With this simplification a theoretical response can be derived by still considering the multiplexer to have an infinite number of channels.

For one channel off—

$$Y_o(p) = \coth\left(\frac{\pi p}{2}\right)$$

$$Y_e(p) = \tanh\left(\frac{\pi p}{2}\right) - \frac{2}{\pi}\left[\frac{p}{p^2+1} - \frac{1}{p}\right] = \tanh\left(\frac{\pi p}{2}\right) + \frac{2}{\pi}\left[\frac{1}{p(p^2+1)}\right]$$

Which gives $$\frac{S_{11}(p)}{S_{12}(p)} = \frac{\frac{2}{\pi}\cosh^2\left(\frac{\pi p}{2}\right)}{p(p^2+1) - \frac{1}{\pi}\sinh(\pi p)}$$

Figure 5A:
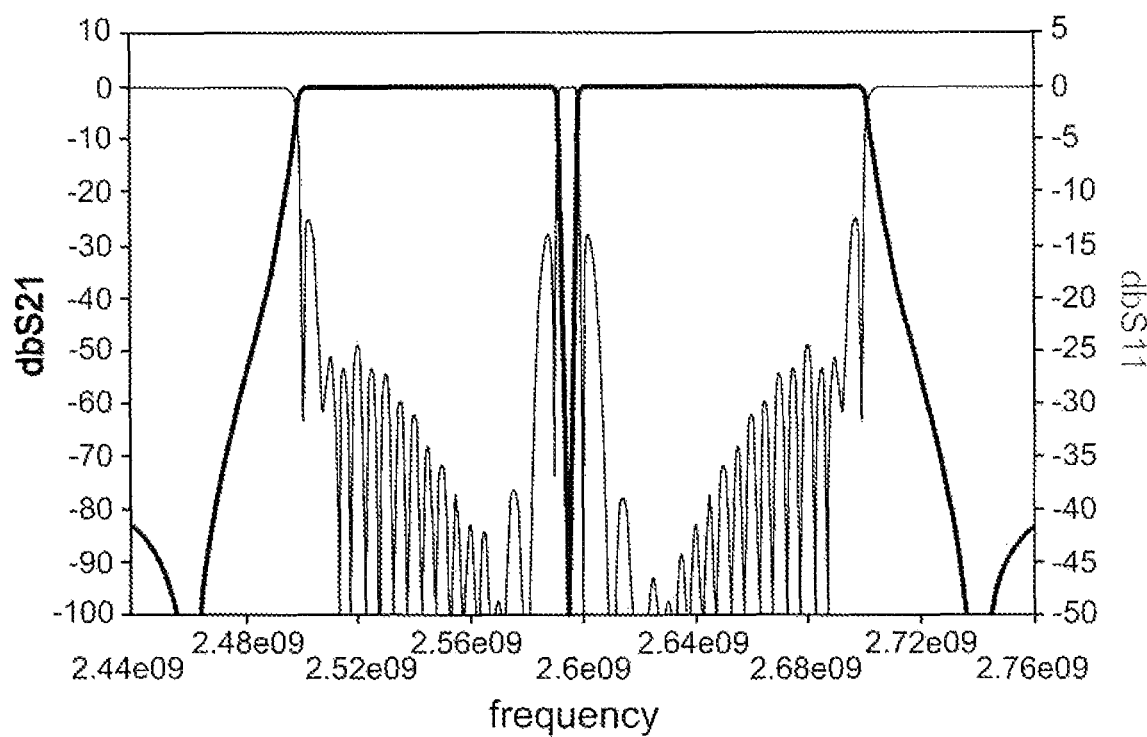
FIG. 5a shows the insertion loss and return loss for the multiplexer of FIG. 4a with one channel switched off.
Figure 5B:
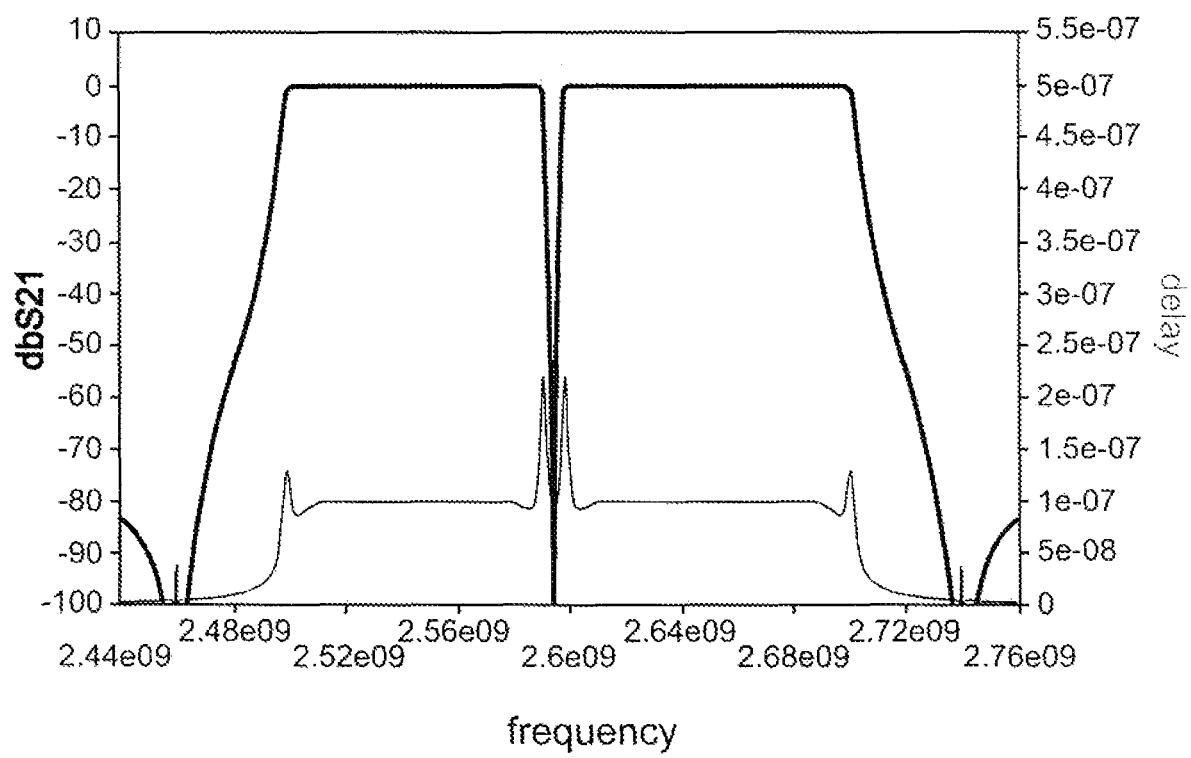
FIG. 5b shows the group delay for the multiplexer of FIG. 4a with one channel switched off.

Hence, $S_{11}(p)$ is zero at $p=+/-j$ and transmission loss ($S_{12}(p)$) has a third order zero at $p=0$. This response is shown in FIG. 5a with group delay in FIG. 5b. The passband begins at $p=+/-j$.

One channel on—

$$Y_o(p) = \coth\left(\frac{\pi p}{2}\right)$$

$$Y_e(p) = \coth\left(\frac{\pi p}{2}\right) - \frac{2}{\pi p(p^2+1)}$$

Hence, $$\frac{S_{11}(p)}{S_{12}(p)} = \frac{\pi p(p^2+1) - \sinh(\pi p)}{2\sinh^2\left(\frac{\pi p}{2}\right)}$$

Since the numerator has a third order zero at $p=0$ and the denominator has a second order zero at $p=0$ then $S_{11}(0)=0$.

Figure 6A:
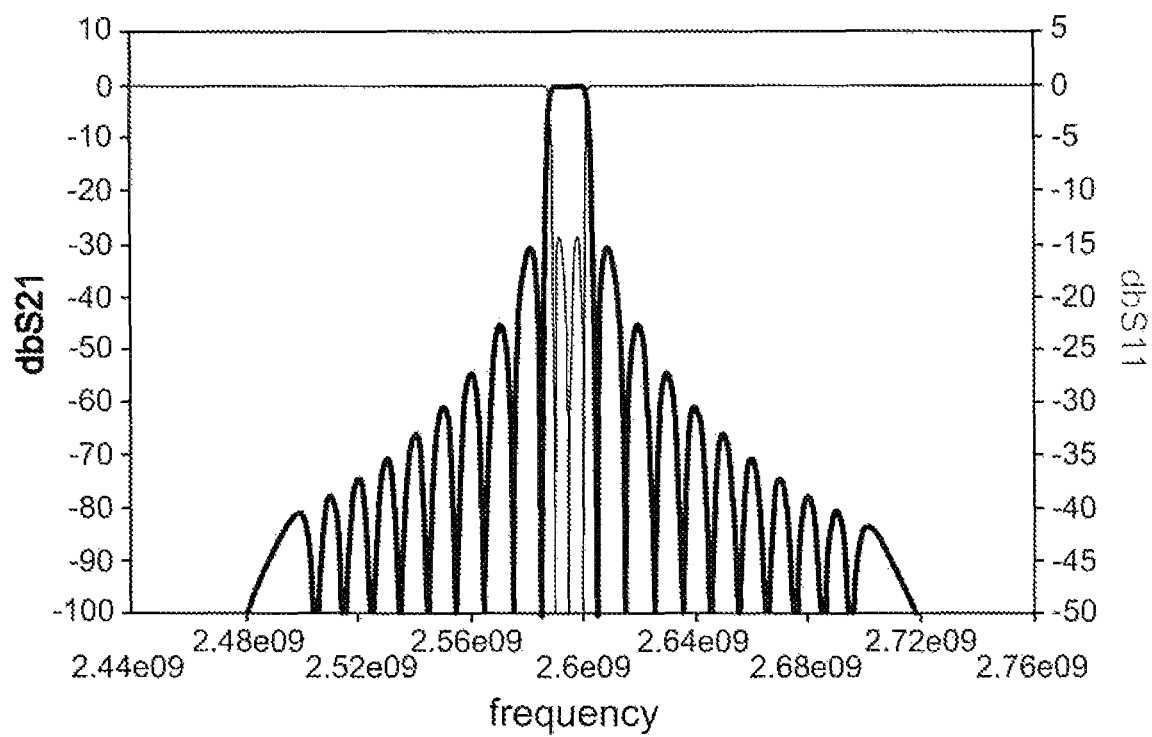
Figure 6B:
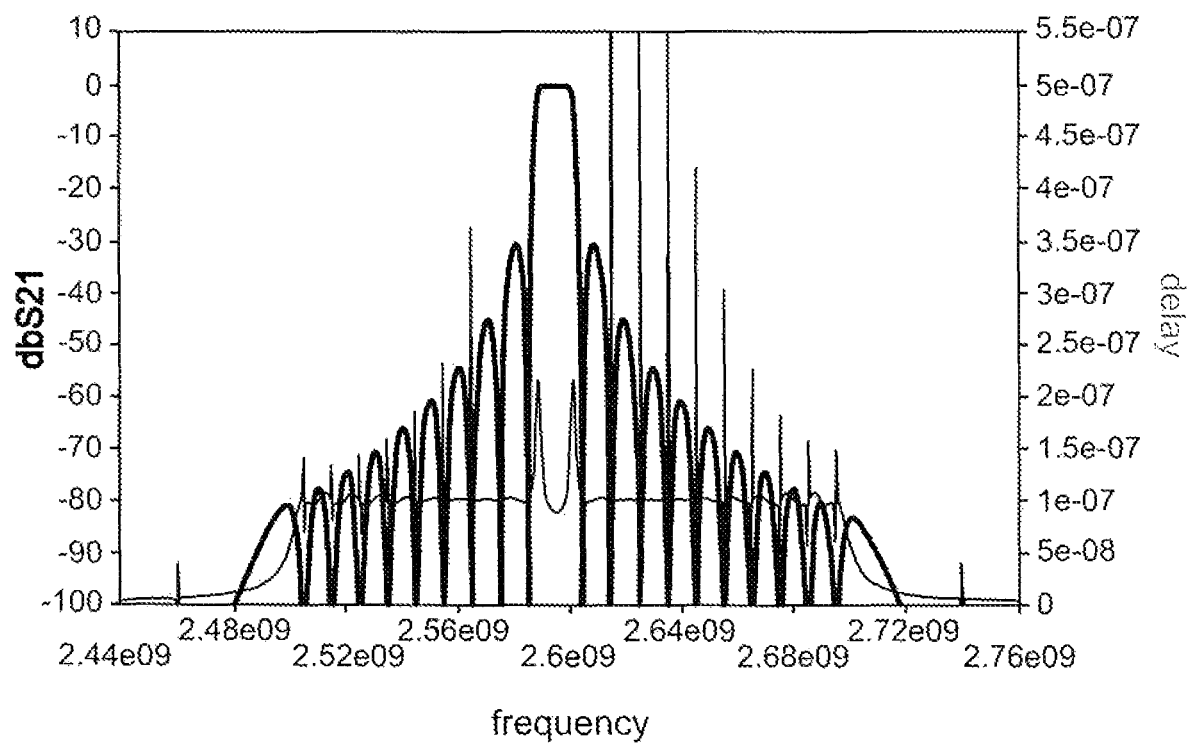

Also, $S_{11}(+/-j)=0$ and $S_{12}(+/-2j)=0$. This response is shown in FIG. 6(a). The group delay is shown in FIG. 6b. In the passband which is between $P=+/-j$ the group delay is below 100 ns at the center of the band rising towards the band edge. The phase response therefore possesses a cubic variation relative to linear phase around the center frequency. The phase response and group delay are obtained from the fractions $1+Y_o(p)$ and $1+Y_e(p)$ in the denominator of equation 3. The phase response for $1+Y_o(p)$ is always linear phase (constant delay) for any switching state. However, for this case one should consider the phase of the factor $$1 + Ye(p) = 1 + \coth\left(\frac{\pi p}{2}\right) - \frac{2}{\pi p(p^2+1)}$$

For $p=jw$ the phase is $\pi w/2$ for linear phase and hence the phase equals this value at $w=0$ and $w=+/-1$. Therefore the phase is an equidistant approximation to linear phase over the full passband between $w=+/-1$.

Three channels off—
For three adjacent channels turned off—

$$Y_o(p) = \coth\left(\frac{\pi p}{2}\right)$$

$$Y_e(p) = \tanh\left(\frac{\pi p}{2}\right) +$$
$$\frac{2}{\pi}\left[\frac{1}{p(p^2+1)} + \frac{1}{(p-j2)((p-j2)^2+1)} + \frac{1}{(p+j2)((p+j2)^2+1)}\right] =$$
$$\tanh\left(\frac{\pi p}{2}\right) + \frac{6(p^4 - 3p^2 + 12)}{\pi p(p^2+1)(p^2+4)(p^2+9)}$$

From which $$\frac{S_{11}(p)}{S_{12}(p)} = \frac{\cosh^2\left(\frac{\pi p}{2}\right)(p^4 - 3p^2 + 12)}{(p^4 - 3p^2 + 12)\sinh(\pi p) - \frac{\pi}{3}p(p^2+1)(p^2+4)(p^2+9)}$$

Figure 7A:
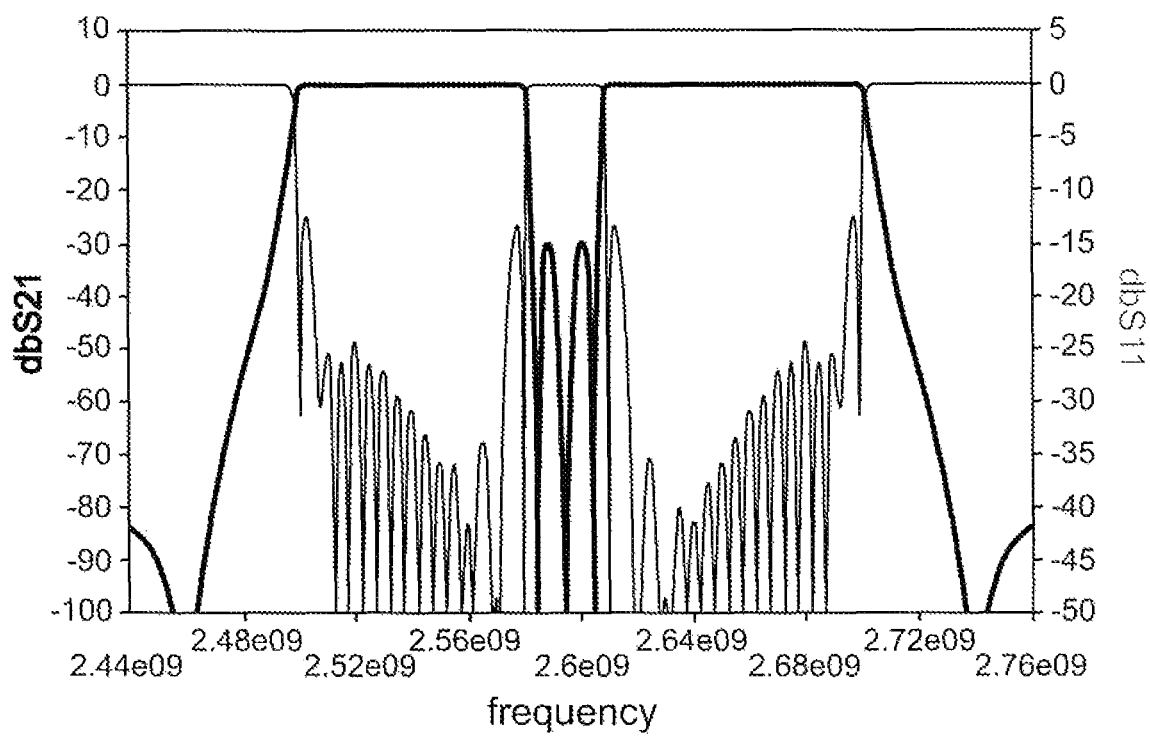
FIG. 7a shows the insertion loss and return loss for the multiplexer of FIG. 4a with three channels switched off.
Figure 7B:
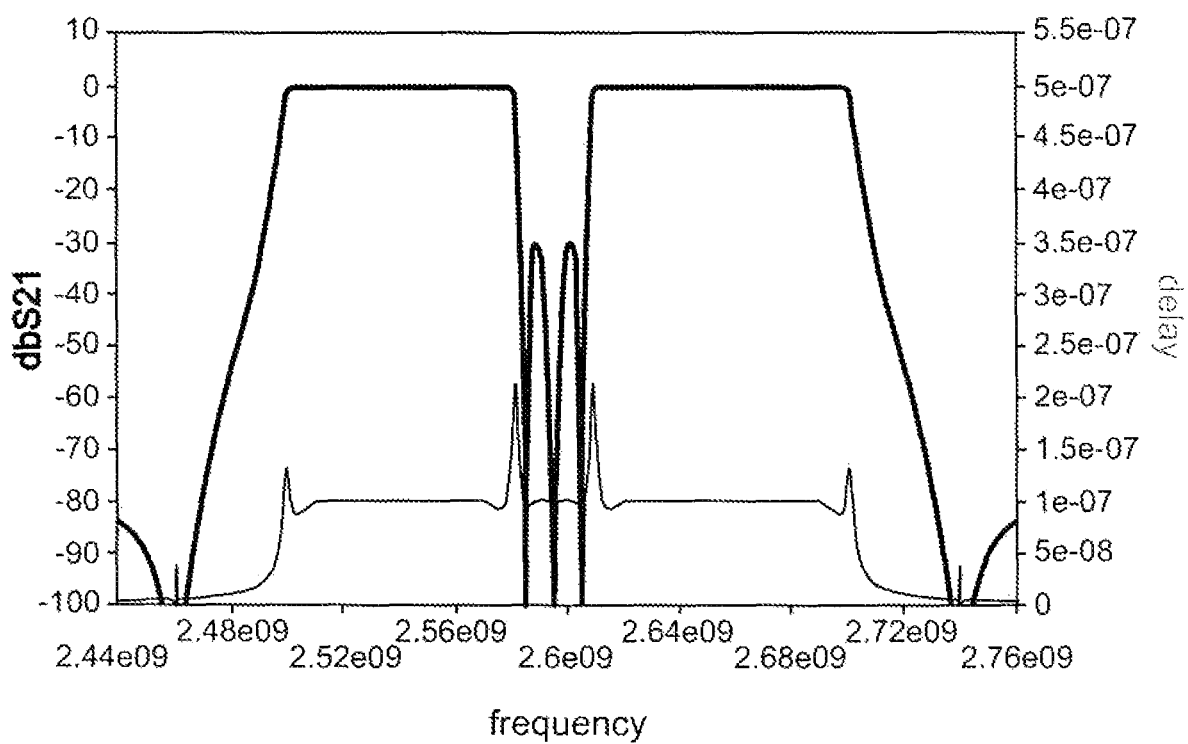
FIG. 7b shows the group delay for the multiplexer of FIG. 4a with three channels switched off.

Hence $S_{11}(p)$ is zero at $p=+/j3$ and close inspection shows that $S_{12}(p)$ has a third order zero at $p=0$ and doubled ordered zeros at $p=+/-j2$. This is illustrated in FIG. 7a with the group delay in FIG. 7b.

Three channels on—
For three adjacent channels turned on—

$$Y_o(p) = \coth\left(\frac{\pi p}{2}\right) \text{ And } Y_e(p) = \coth(p) - \frac{6(p^4 - 3p^2 + 12)}{\pi p(p^2+1)(p^2+4)(p^2+9)}$$

Which gives $$\frac{S_{11}(p)}{S_{12}(p)} = \frac{\frac{\pi}{3}p(p^2+1)(p^2+4)(p^2+9) - \sinh(\pi p)(p^4 - 3p^2 + 12)}{2\sinh^2\left(\frac{\pi p}{2}\right)(p^4 - 3p^2 + 12)}$$

Figure 8A:
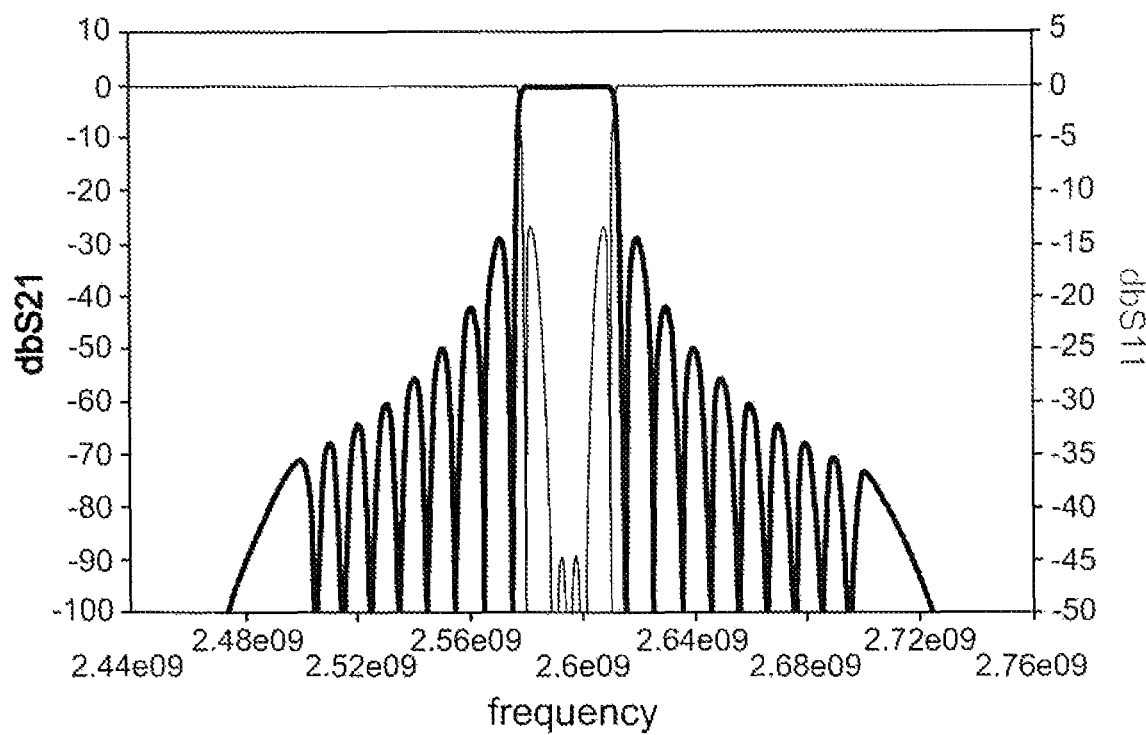
Figure 8B:
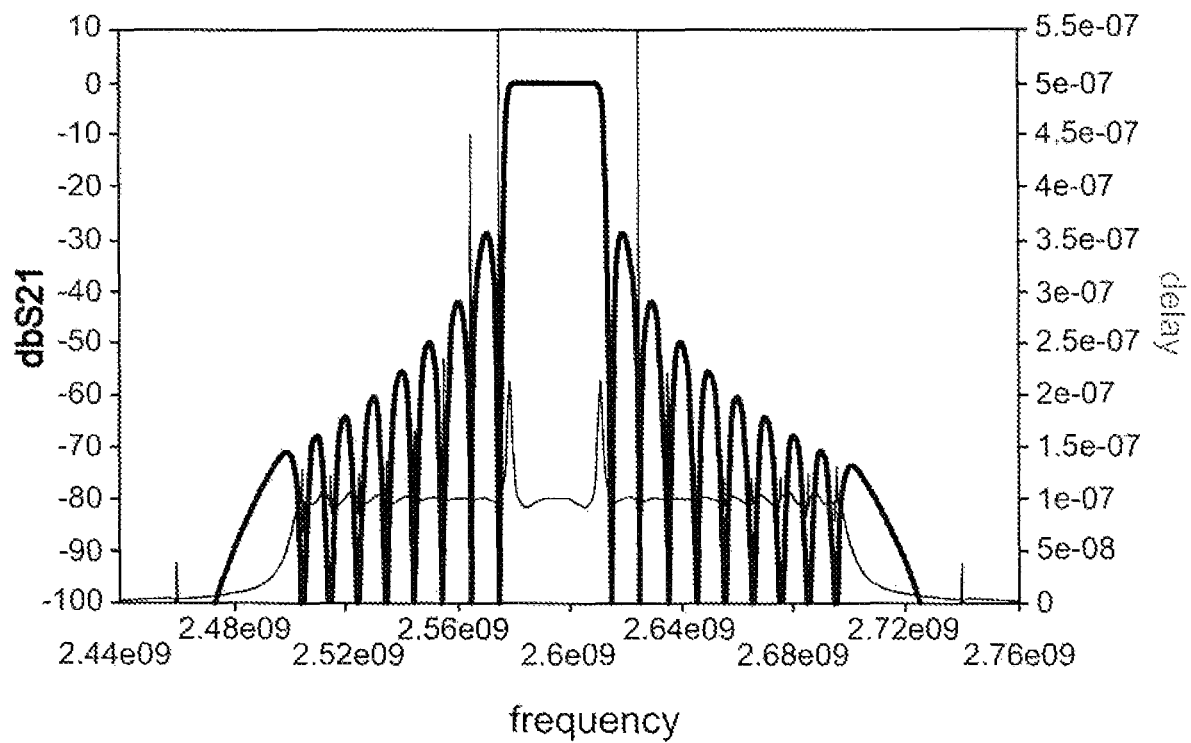
FIG. 8b shows the group delay for the multiplexer of FIG. 4a with three channels switched off.

Close inspection shows that $S_{11}(p)$ has single ordered zeros at $p=0$, $p=+/-j3$ but double ordered zeros at $p=+/-j$. This response is shown in FIG. 8a. From Equation 15 it can be readily deduced that the phase response is an equidistant approximation to linear phase and equal at $p=0$, $+/j$, $+/-j2$, $+/-j3$ hence, equidistant over the entire passband. The corresponding group delay is shown in FIG. 8b.

Figure 9A:
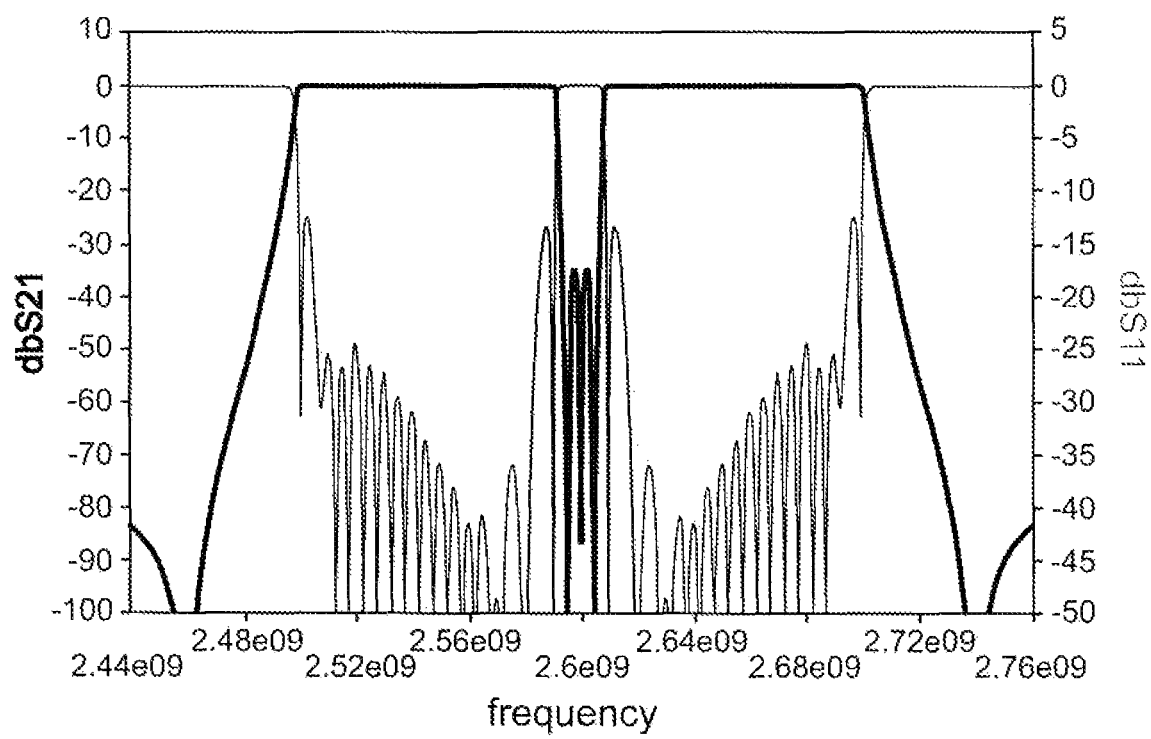
FIG. 9a shows the insertion loss and return loss for the multiplexer of FIG. 4a with two channels switched off.
Figure 9B:
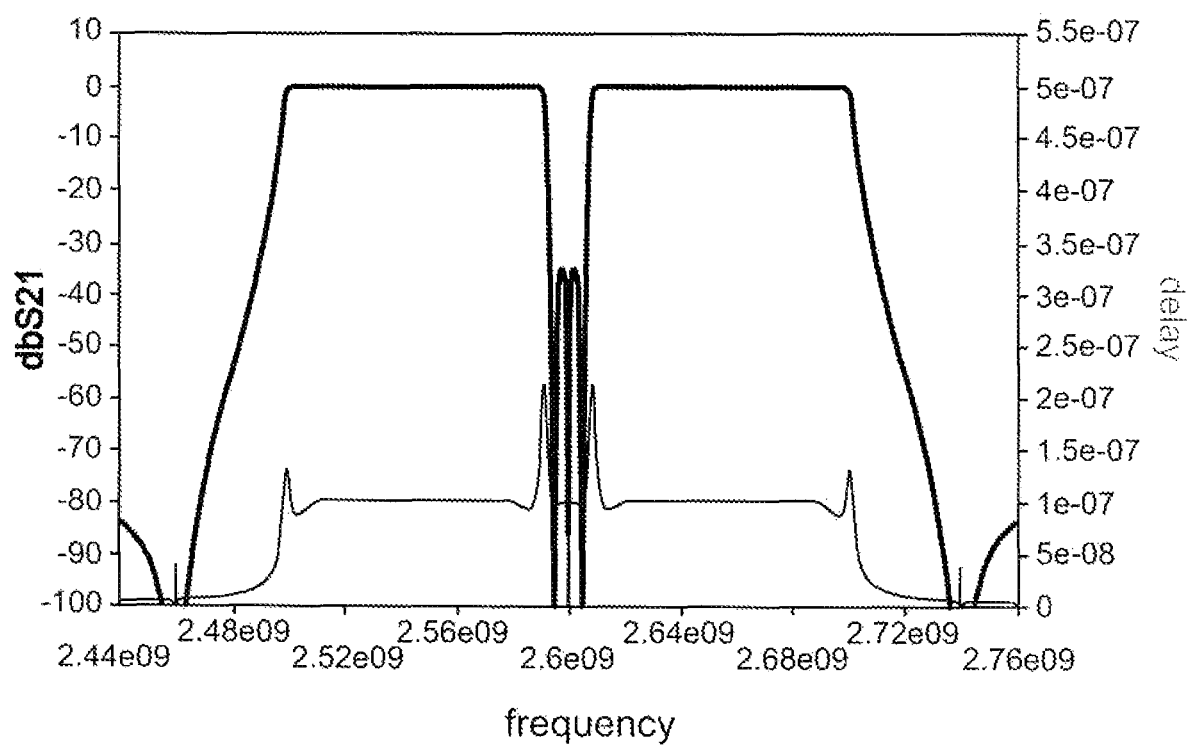
FIG. 9b shows the group delay for the multiplexer of FIG. 4a with two channels switched off.

To deal with the even degree cases (ie the multiplexer having an even number of transmission channels having transmission bands arranged symmetrically about the center of the multiplexer passband) it is easier to perform the transformation $p \rightarrow p+j$ which produces symmetrical responses around $p=0$. For example for the second degree case one has Two channels off—

$$\frac{S_{11}(p)}{S_{12}(p)} = \frac{2\sinh^2\left(\frac{\pi p}{2}\right)(p^2 - 2)}{\pi/2p(p^2+1)(p^2+4) + \sinh(\pi p)(p^2 - 2)}$$

Where $S_{11}(p)$ is zero at $p=+/-j2$ and $S_{12}(p)$ has a single ordered zero at $p=0$ and double ordered zeros at $p=+/-j$ as shown in FIGS. 9a and 9b.

Two channels on—

$$\frac{S_{11}(p)}{S_{12}(p)} = \frac{\pi/2p(p^2+1)(p^2+4) + \sinh(\pi p)(p^2 - 2)}{-2(p^2 - 2)\cosh^2\left(\frac{\pi p}{2}\right)}$$

Figure 10A:
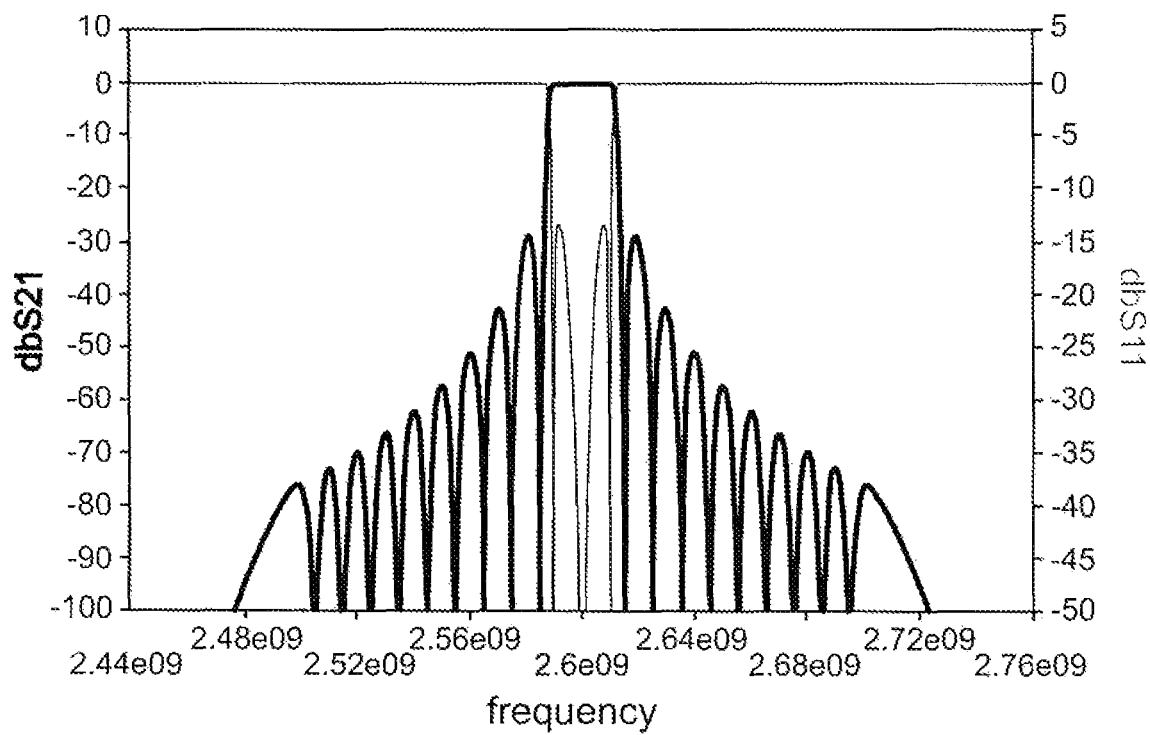
Figure 10B:
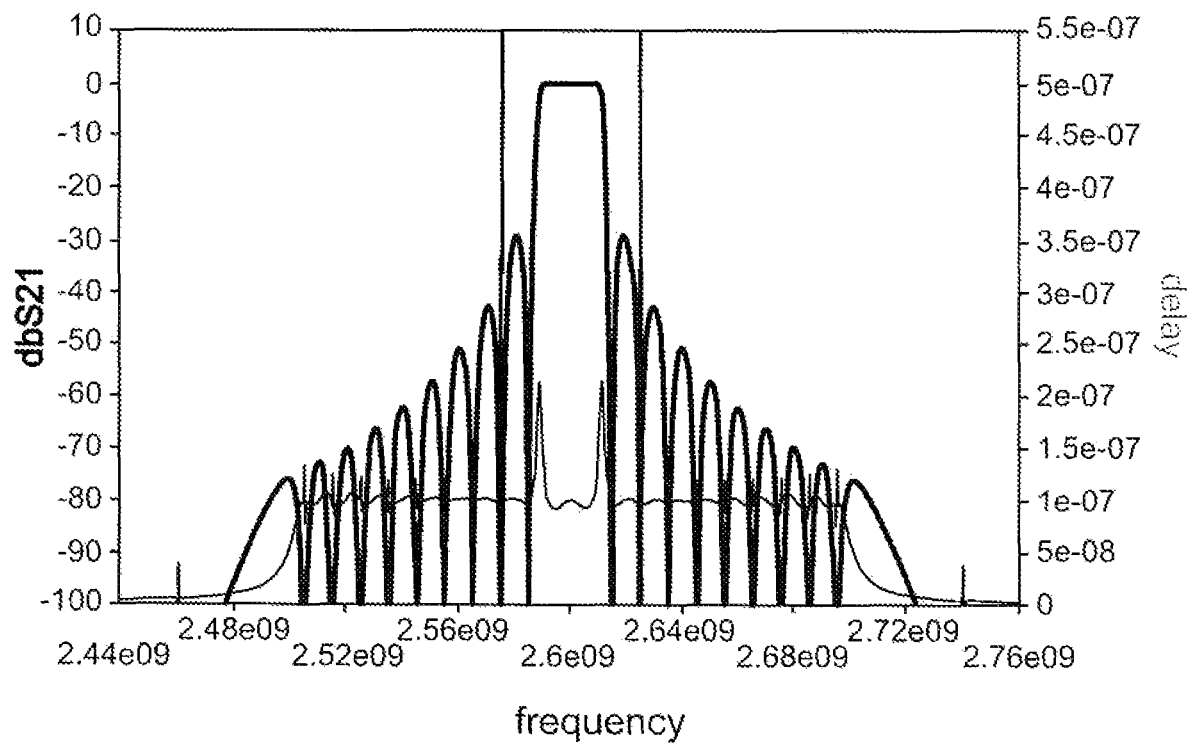
Figure 11A:
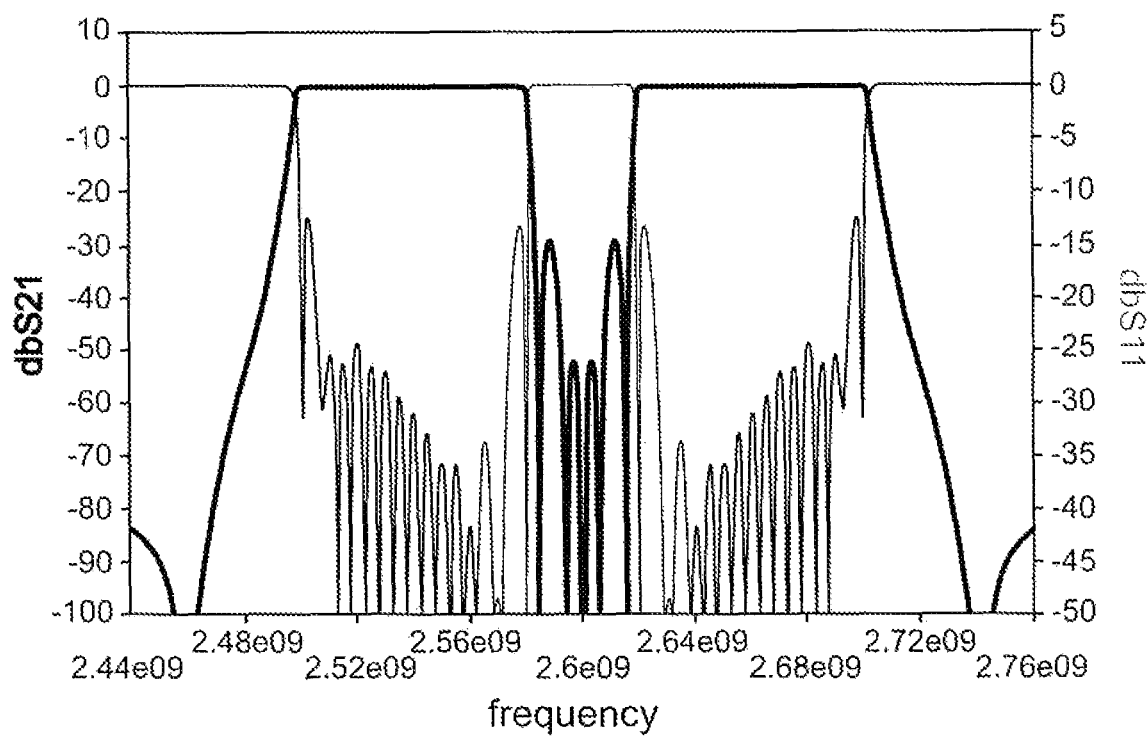
FIG. 11a shows the insertion loss and return loss for the multiplexer of FIG. 4a with four channels switched off.
Figure 11B:
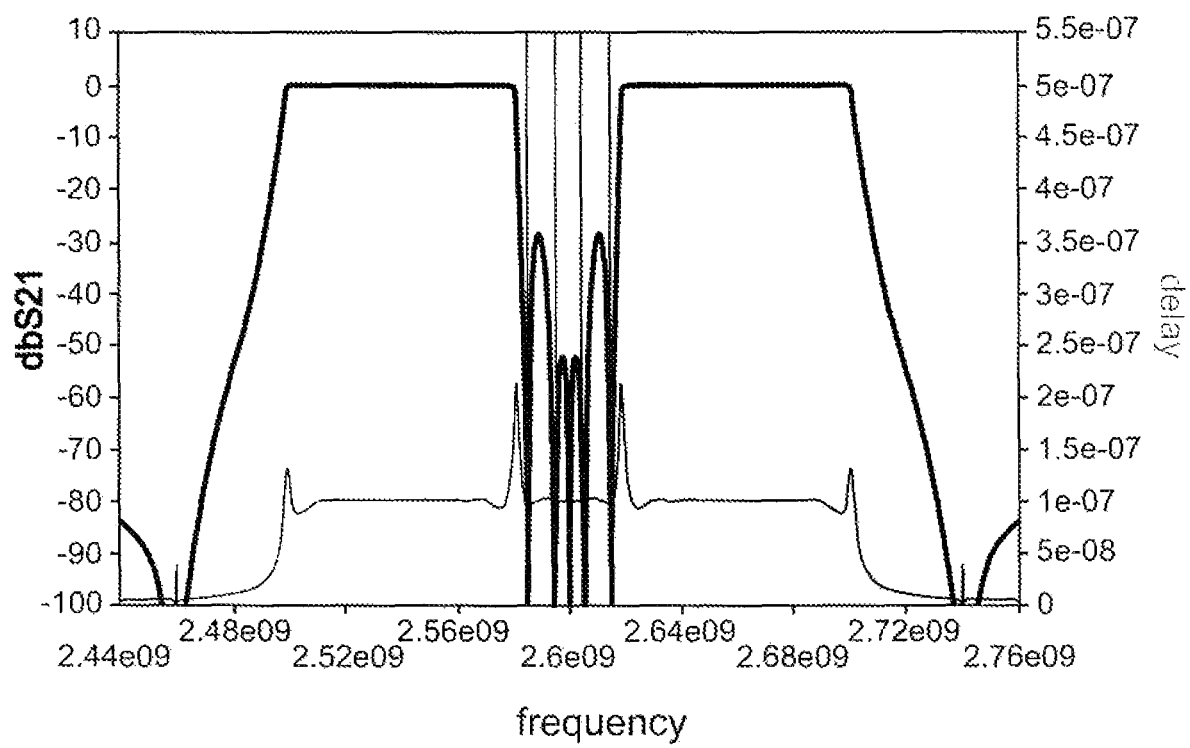
FIG. 11b shows the group delay for the multiplexer of FIG. 4a with four channels switched off.
Figure 12A:
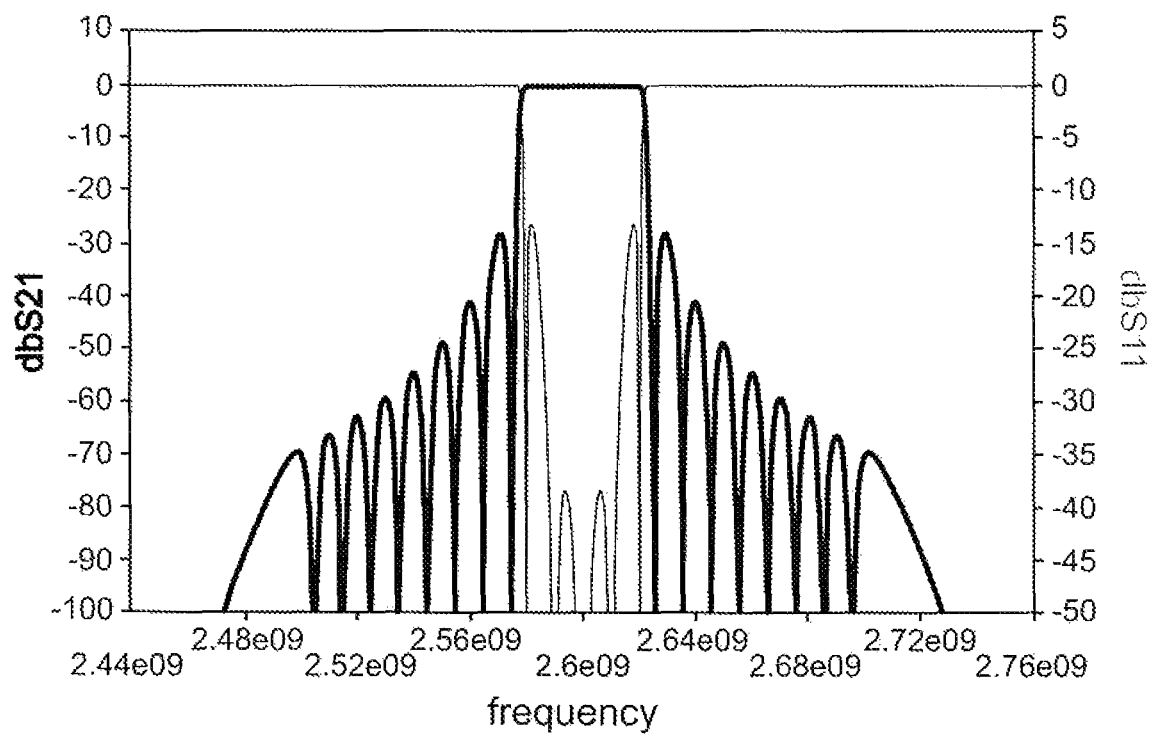
Figure 12B:
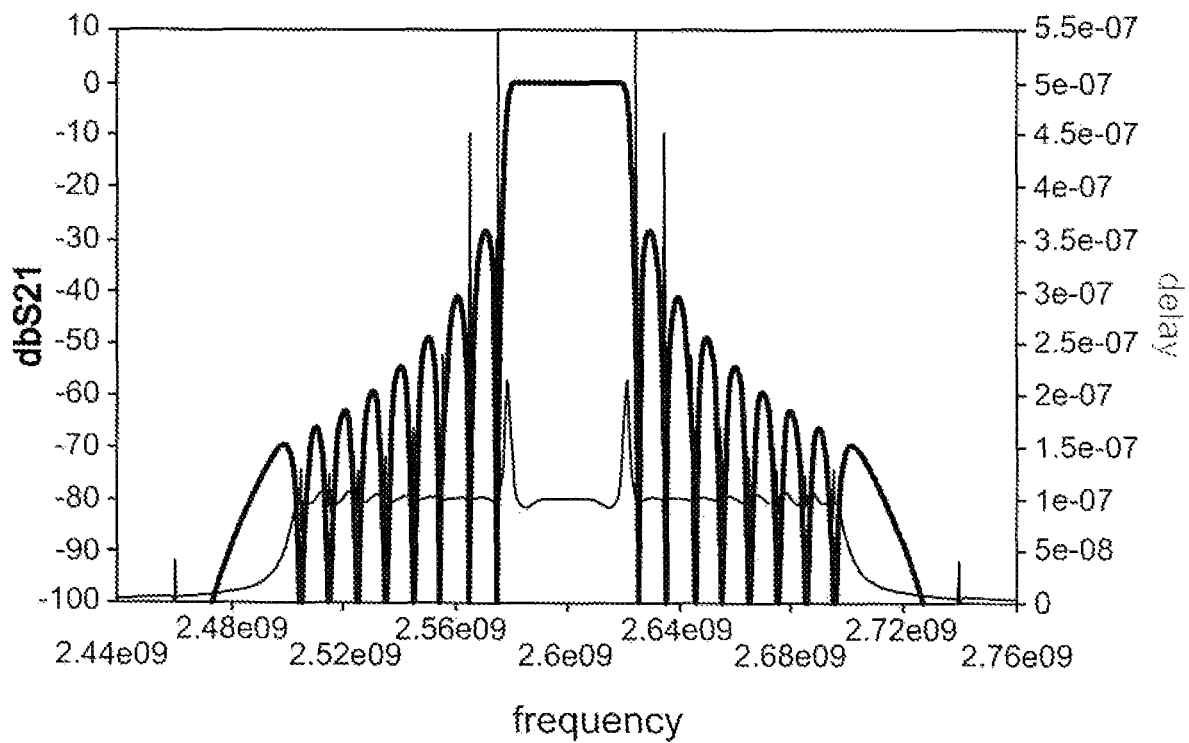

Hence $S_{41}(p)$ has a third order zero at $p=0$ and zeros at $p=+/-j$ as shown in FIG. 10a. The phase response of $S_{12}(p)$ is an equidistant approximation to linear phase at $p=0$, $+/-j$, $+/-j2$ and the corresponding group delay is shown in FIG. 10b.

Plots are also shown in FIGS. 11a, 11b, 12a and 12b for four channels off and on.

Figure 13A:
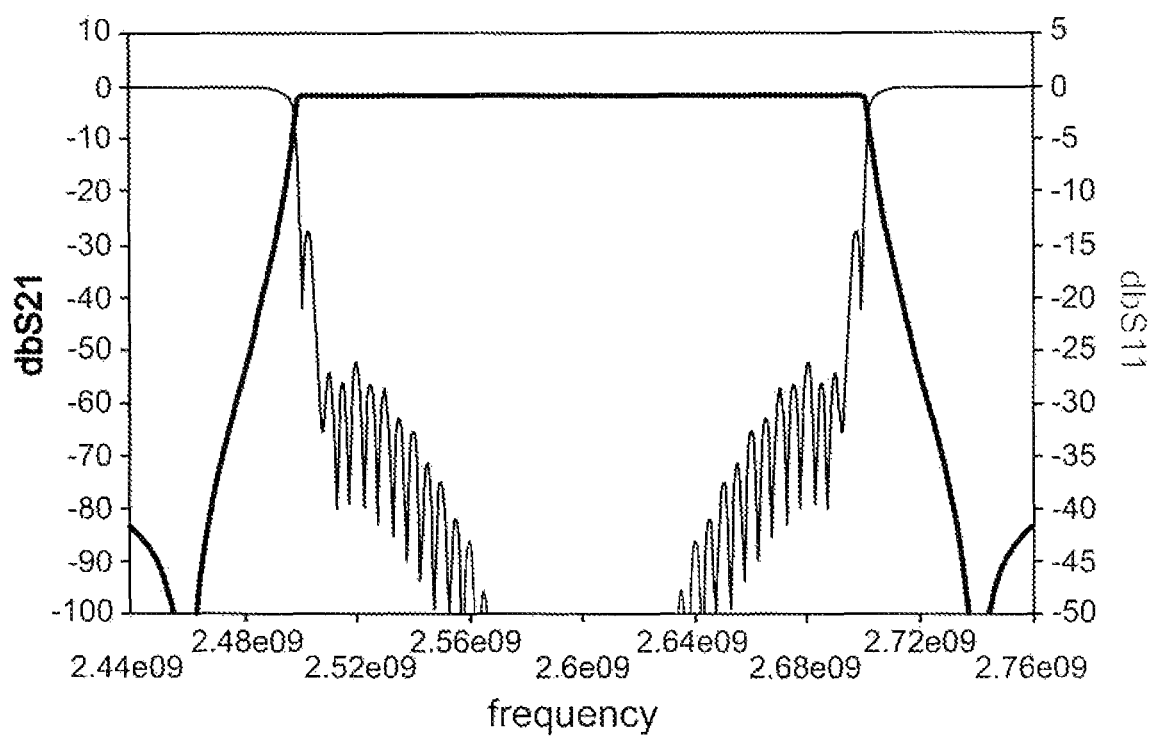
FIG. 13a shows the insertion loss and return loss for the multiplexer of FIG. 4a with all channels switched on and the resonators having finite Q.
Figure 13B:
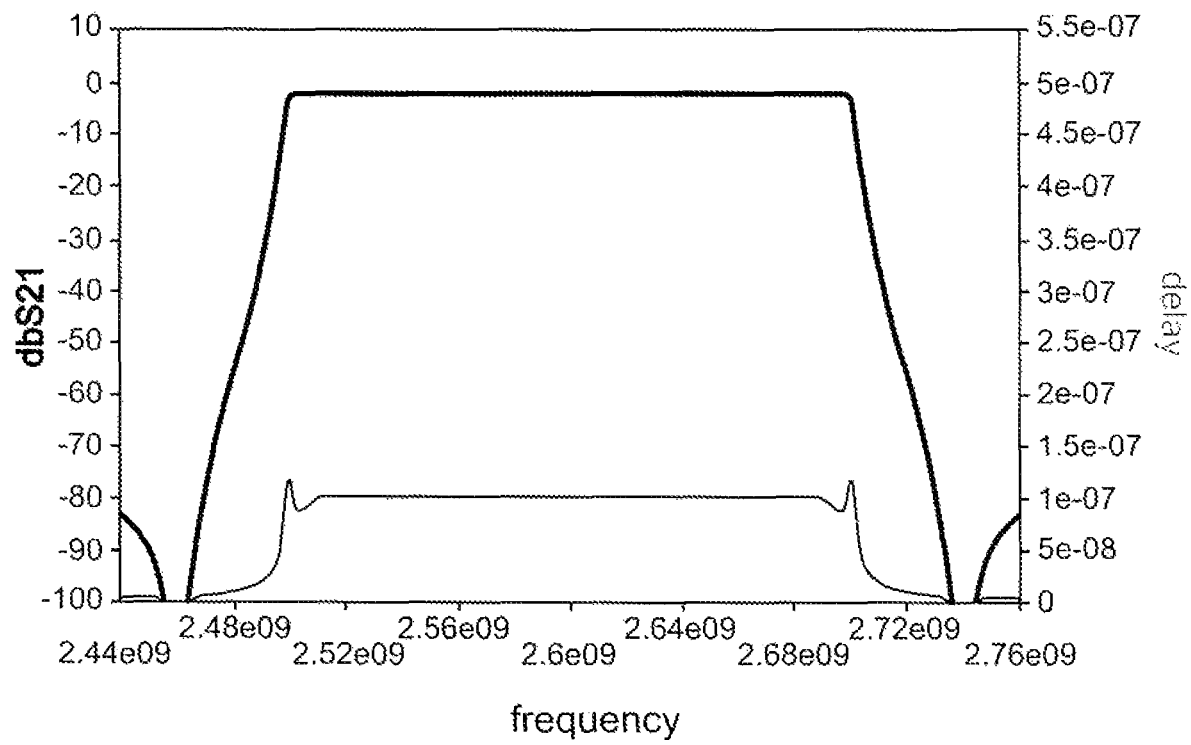
FIG. 13b shows the group delay for the multiplexer of FIG. 4a with all channels switched on and the resonators having finite Q.

If finite dissipation loss (ie finite Q) is introduced into the resonators of the transmission channels then due to the good return loss and approximately constant delay the overall loss in the respective transmission channel passbands will be very flat. This is illustrated in FIGS. 13a and 13b.

Whilst the above described microwave switched multiplexer clearly has highly desirable it is not possible to effectively impedance match to the multiplexer across the bandpass so resulting in unacceptable loss.

The microwave switched multiplexer according to the invention is similar to that described above. As before the switched multiplexer comprises a finite number of transmission channels each comprising input, center and output resonators connected in cascade. The admittances and resonant frequencies of these resonators are as previously described. However, the input resonators of each transmission channel are coupled to a common input microwave resonant waveguide. The input microwave resonant waveguide received a microwave signal from an input microwave signal line. In contrast to the switched multiplexer described with reference to FIGS. 4(a) to 13(b) the input microwave signal line is not directly coupled to the transmission channels but only through the microwave resonant waveguide. Similarly, the output resonators of each transmission channel are coupled to a common output microwave resonant waveguide. The signal from the switched multiplexer is received via an output microwave signal line inserted into the output microwave resonant waveguide. These common input and output microwave resonant waveguides compensate for all of the infinite number of transmission channels that are in the permanently off (odd mode) state and which are absent from the multiplexer having a finite number of transmission channels. These input and output microwave resonant waveguides have fixed admittance values which are a function of the number of active channels. The values of the admittances are obtained by ensuring that the mid band delay is correct and a match occurs at the band edge frequencies of the entire switched multiplexer in the odd state.

In practice this requirement can be realised by ensuring that the admittances of the input microwave resonant waveguide, input resonators, center resonators and output resonators are in the ratio $$y/n:\pi/2:4x/\pi:\pi/2$$

Where y is in the range 0.5 to 1.5 and x is in the range 0.9 to 1.1. Preferably y is in the range 0.8 to 1.2, more preferably in the range 0.9 to 1.1, more preferably 0.95 to 1.05. Preferably x is in the range 0.95 to 1.05, more preferably 0.97 to 1.03, more preferably 0.99 to 1.01.

Shown in FIG. 14(a) is the insertion loss and return loss for a microwave switched multiplexer according to the invention with all channels switched on. In FIG. 14(b) group delay is plotted showing constant delay across most of the multiplexer bandpass. As described above the microwave switched multiplexer is similar to that employed for FIGS. 4(a) and 4(b) except it now includes the input and output microwave resonant waveguides. In this particular example the admittances are set such that x=1 and y=1.05.

FIGS. 15(a) and 15(b) are equivalent plots to FIGS. 14(a) and 14(b) but with one transmission channel of the microwave switched multiplexer switched off.

FIGS. 16(a) and 16(b) are equivalent plots to FIGS. 14(a) and 14(b) with three transmission channels on.

FIGS. 17(a) and 17(b) are equivalent to FIGS. 14(a) and 14(b) with all channels on except the resonators have finite Q. As before the behaviour of the microwave switched resonator is substantially independent of Q value.

As can be seen from FIGS. 14(a) to 17(b) inclusion of the input and output microwave resonant waveguides in the microwave switched multiplexer has little effect on the desirable properties of the microwave switched multiplexer. The important difference however is that it is now possible to match to the microwave switched multiplexer according to the invention across the microwave bandpass with negligible loss.

Shown in FIG. 18 is a specific embodiment of a microwave switched multiplexer 1 according to the invention in cross section. The microwave switched multiplexer 1 has a bandpass $\Delta f$ between frequencies $f_1$ and $f_2$ with $\Delta f=f_1-f_2$. The microwave switched multiplexer 1 comprises an input microwave resonant waveguide 2 and an output microwave resonant waveguide 3. Coupled to the input and output microwave resonant waveguides 2,3 are three transmission channels 4. Each transmission channel 4 comprises an input microwave resonator 5, an output microwave resonator 6 and a center microwave resonator 7. Each microwave resonator 5,6,7 comprises an electrically conducting resonator cavity 8 comprising first and second end faces and a side wall 9 extending therebetween. The cavities 8 are shown in plan view and so only the side wall 9 of circular cross section is shown. Arranged in each cavity 8 is a circular dielectric member 10. Each dielectric member 10 is spaced apart from the first and second end faces of its associated cavity 8. The length of each cavity 8 is defined by the distance between its end faces. The width of each cavity 8 in a plane normal to the length is at least four times the length.

Extending through the center of each dielectric member 10 is a small aperture 11. Associated with each center resonator 7 is a tuning mechanism 12. The tuning mechanism 12 comprises a finger 13 which can be inserted into the aperture 11 of the dielectric member 10 of the center resonator 7. When the finger 13 is in the aperture 11 the center resonator 7 (and the associated transmission channel 4) is in the off configuration with the center resonator 7 effectively being shorted (or more generally having a resonant frequency out of the passband of the multiplexer 1). When the finger 13 is not in the aperture 11 the center resonator 7 and the associated transmission channel 4 is in the on configuration. In the on configuration all of the resonators 5,6,7 in a transmission channel 4 have the same resonant frequency.

The input resonator 5 is coupled to the input microwave resonant waveguide 2 by means of an aperture 14 in the side wall 9 of its cavity 8 as shown. The output resonator 6 is coupled to the output microwave resonant waveguide 3 by means of an aperture 15 in the side wall 9 of its cavity 8 as shown. Similarly, the center resonator 7 is coupled to the input and output resonators 5,6 by means of apertures 16 in the side wall 9 of its resonator cavity 8.

Each transmission channel 4 is defined by a transmission bandpass having a center frequency. The center frequency of a transmission channel 4 is determined by the resonant frequency of the resonators 5,6,7 (in the on state) in that transmission channel 4. The resonators 5,6,7 may be tuneable (by known means such as displacement of the dielectric member or a metal rod within the resonator cavity 8) or may have a fixed frequency.

The center frequencies of the transmission channels 4 are equally spaced apart. Generally, if the bandpass of the multiplexer 1 is $\Delta f$ and there are n transmission channels 4 they are spaced apart in frequency by $\Delta f/n$.

Considering one transmission channel 4 again, as explained above the admittances of the resonators 5,6,7 are designed to be substantially in the ratio input:center:output $\pi/2:4/\pi:\pi/2$. Whilst this ratio of admittances is ideal in a practical device a more general range of admittance ratios will still provide an acceptable performance. More generally the ratio of admittances is in the range $\pi/2:x4/\pi:\pi/2$ with x in the range 0.9 to 1.1, more preferably 0.95 to 1.05, more preferably 0.97 to 1.03, more preferably 0.99 to 1.01, more preferably 1.

The absolute values of the admittances of the resonators 5,6,7 within a transmission channel 4 are set so that the transmission bandpass of the transmission channel 4 is equal to the separation between the center frequencies of the transmission channels, or in other words that the transmission bandpasses are substantially contiguous. The transmission channels 4 interact and so the transmission bandpass of a channel is measured with that transmission channel 4 in the on state and all other transmission channels 4 in the off state.

In the particular embodiment shown in FIG. 18 all of the input resonators 5 have the same admittance. All of the output resonators 6 have the same admittance and all of the center resonators 7 have the same admittance, so producing transmission channels 4 which all have the same transmission bandpass, merely separated equally in frequency.

The input and output microwave resonant waveguides 2,3 have the same admittances. The admittances of the input microwave resonant waveguide 2, input resonators 5, center resonators 7 and output resonators 6 are in the ratio $$y/n:\pi/2:4x/\pi:\pi/2$$

as previously described.

Typically the microwave signal is provided to the input microwave resonant waveguide 2 of the microwave switched multiplexer 1 by means of an input signal line 17 inserted into the input microwave resonant waveguide 2. The input signal line 17 is typically connected to a microwave source (not shown). The microwave source can be a microwave transmitter adapted to provide a microwave signal with a frequency in the range $f_1$ to $f_2$. Alternatively the microwave source may be an antenna adapted to receive a microwave signal in this range. The output from the microwave switched multiplexer 1 is received from an output signal line 18 which is inserted into the output microwave resonant waveguide 3.

Shown in FIG. 19 is one transmission channel 4 of an alternative embodiment of a switched microwave multiplexer 1 according to the invention. As before the transmission channel 4 comprises an input resonator 5 coupled to an input microwave resonant waveguide 2, an output microwave resonator 6 coupled to an output microwave resonant waveguide 3 and a center resonator 7 connected between the two. The resonators 5,6,7 are connected in cascade.

In this embodiment each resonator 5,6,7 comprises an electrically conducting resonator cavity 20 comprising first and second end faces 21,22 and a side wall 23 extending therebetween. Arranged within the cavity 20 is a resonator post 24 extending from one end face 21 part way towards the other end face 22. The resonators 5,6,7 are coupled to each other and to the microwave resonant waveguides 2,3 through apertures 25 in the side walls of their resonator cavities 20 as shown.

Connected to the center resonator 7 is a tuning mechanism 26. The tuning mechanism 26 comprises a switch 27 connected between the end of the resonator post 24 and the remote end face 22 of the resonator cavity 20. In the on configuration the switch 27 is open circuit and so the center resonator 7 resonates at the same frequency as the input and output resonators 5,6. In the closed configuration the switch 27 is closed circuit so shorting the resonator post 24 and resonant cavity 20 together.

In an alternative embodiment of the invention the microwave resonators 5,6,7 of the transmission channels 4 are FBAR (thin film bulk acoustic resonators) or alternatively SAW (surface acoustic wave) resonators. Such resonators 5,6,7 are known in the art and accordingly are not described in detail. Such resonators 5,6,7 are more compact than the resonators described above. By employing such resonators 5,6,7 the microwave switched multiplexer 1 can be made sufficiently compact that it can be employed in mobile telecommunications devices such as mobile telephones.

As mentioned above the behaviour of the microwave switched multiplexer 1 according to the invention is substantially insensitive to the Q values of the resonators 5,6,7. Nonetheless, resonators having Q values in the range 500 to 4000, more preferably 1000 to 3000 are typically employed.

The microwave switched multiplexer 1 according to the invention possesses a number of unique properties—

For any transmission channel 4 in the switched on state the phase response over the entire passband is an equidistant approximation to linear phase and hence produces a constant delay over most of the band.

For any transmission channel 4 on the on state the passband has the maximum number of zeros in the return loss including both band edge frequencies.

If two or more adjacent transmission channels 4 are switched on a single bandpass filter response is created which has an equidistant approximation to linear phase over the entire combined passband. Furthermore, the overall return loss function has the maximum number of zeros over the entire combined filter response.

If finite dissipation loss is introduced into the resonators 5,6,7, in the passbands, due to the good return loss and approximately constant delay the overall loss in the respective passbands will be very flat.

Finally, it is possible to match to the microwave switched multiplexer 1 across the transmission band with very little loss.

In the above description reference is made to the width of the transmission bandpass of a single transmission channel. As the transmission channels interact the width of the transmission bandpass of a transmission channel is measured with only one transmission channel switched on and all other transmission channels switched off. FIG. 20 shows, in schematic form, insertion loss and return loss for a single transmission channel within and close to the edges of a transmission bandpass. As can be seen, at the center of the bandpass there is an infinity in the return loss. At each edge of the bandpass there is a further infinity in the return loss. The width of the transmission bandpass is the difference in frequency between these two edge infinities.

The invention claimed is:

1. A microwave switched multiplexer having a bandpass $\Delta f$ between frequencies f1 and f2, $\Delta f=f1-f2$, the multiplexer comprising:
    an input microwave resonant waveguide;
    an output microwave resonant waveguide; and,
    n transmission channels where n>1, each transmission channel coupled to the input microwave resonant waveguide and the output microwave resonant waveguide, each transmission channel having a transmission bandpass at a center frequency within $\Delta f$, the center frequencies of the transmission channels being equally spaced apart in frequency by $\Delta f/n$;
    each transmission channel comprising:
        (a) an input resonator coupled to the input microwave resonant waveguide;
        (b) an output resonator coupled to the output microwave resonant waveguide;
        (c) a center resonator coupled to the input and output resonators, the three resonators being coupled together in cascade;
        (d) a tuning mechanism connected to the center resonator and adapted to be switched between on and off states, in the on state the resonant frequency of the center resonator being the same as that of the input and output resonators and in the off state the resonant frequency of the center resonator being outside the bandpass $\Delta f$; the admittances of the input microwave resonant waveguide, input resonator, center resonator and output resonator being in the ratio $$y/n : \pi/2 : 4x/\pi : \pi/2$$

where x is ln the range 0.9 to 1.1 and where y is in the range 0.5 to 1.5; and
    the admittances of the input, center and output resonators having absolute values such that for every transmission channel when the tuning mechanism of the transmission channel is in the on state and the tuning mechanisms of all other transmission channels are in the off state the width of the transmission bandpass of the transmission channel is substantially $\Delta f/n$.

2. A microwave switched multiplexer as claimed in claim 1, wherein y is in the range 0.8 to 1.2.

3. A microwave switched multiplexer as claimed in claim 1, wherein y is in the range 0.9 to 1.1.

4. A microwave switched multiplexer as claimed in claim 1, wherein y is in the range 0.95 to 1.05.

5. A microwave switched multiplexer as claimed in claim 1, wherein x is in the range 0.95 to 1.05.

6. A microwave switched multiplexer as claimed in claim 1, wherein x is in the range 0.97 to 1.03.

7. A microwave switched multiplexer as claimed in claim 1, wherein x is in the range 0.99 to 1.01.

8. A microwave switched resonator as claimed in claim 1, wherein n is odd.

9. A microwave switched resonator as claimed in claim 1, wherein n is even.

10. A microwave switched multiplexer as claimed in claim 1, wherein the admittance of the output microwave resonant waveguide is equal to the admittance of the input microwave resonant waveguide.

11. A microwave switched multiplexer as claimed in claim 1, wherein each resonator comprises an electrically conducting resonant cavity comprising first and second end faces and a side wall extending therebetween, the resonator further comprising a dielectric member arranged within the cavity and spaced apart from the end faces; and
the distance between the first and second end faces defining the length of the cavity, the width of the cavity in a plane normal to the length being at least four times the length.

12. A microwave switched multiplexer as claimed in claim 11, wherein the dielectric member of the center resonator comprises an aperture extending therethrough, the tuning mechanism comprising a rod which can be inserted or removed from the aperture to switch the center resonator between on and off states.

13. A microwave switched multiplexer as claimed in claim 1, wherein each resonator comprises an electrically conducing cavity comprising first and second end faces and a side wall extending therebetween, the resonator further comprising a resonator post extending from an end face part, way to the opposite end face.

14. A microwave switched multiplexer as claimed in claim 13, wherein the tuning mechanism comprises an electrical switch extending between the resonator post of the center resonator to the spaced apart end face.

15. A microwave switched multiplexer as claimed in claim 1, wherein each resonator is an FBAR or SAW resonator.

16. A microwave switched multiplexer as claimed in claim 1, further comprising a microwave source connected to the input microwave resonant waveguide, the microwave source being adapted to provide a microwave signal having a frequency between $f_1$ and $f_2$.

17. A mobile telecommunications device comprising:
at least one microwave switched multiplexer having a bandpass $\Delta f$ between frequencies f1 and f2, $\Delta f = f1 - f2$, the multiplexer comprising:
an input microwave resonant waveguide;
an output microwave resonant waveguide; and,
n transmission channels where n>1, each transmission channel coupled to the input microwave resonant waveguide and the output microwave resonant waveguide, each transmission channel having a transmission bandpass at a center frequency within $\Delta f$, the center frequencies of the transmission channels being equally spaced apart in frequency by $\Delta f/n$;
each transmission channel comprising:
(a) an input resonator coupled to the input microwave resonant waveguide;
(b) an output resonator coupled to the output microwave resonant waveguide;
(c) a center resonator coupled to the input and output resonators, the three resonators being coupled together in cascade;
(d) a tuning mechanism connected to the center resonator and adapted to be switched between on and off states, in the on state the resonant frequency of the center resonator being the same as that of the input and output resonators and in the off state the resonant frequency of the center resonator being outside the bandpass $\Delta f$;
the admittances of the input microwave resonant waveguide, input resonator, center resonator and output resonator being in the ratio $y/n:\pi/2:4x/\pi:\pi/2$ where x is ln the range 0.9 to 1.1 and where y is in the range 0.5 to 1.5; and
the admittances of the input, center and output resonators having absolute values such that for every transmission channel when the tuning mechanism of the transmission channel is in the on state and the tuning mechanisms of all other transmission channels are in the off state the width of the transmission bandpass of the transmission channel is substantially $\Delta f/n$.

* * * * *